US006780001B2

(12) United States Patent
Eldridge et al.

(10) Patent No.: US 6,780,001 B2
(45) Date of Patent: Aug. 24, 2004

(54) FORMING TOOL FOR FORMING A CONTOURED MICROELECTRONIC SPRING MOLD

(75) Inventors: Benjamin N. Eldridge, Danville, CA (US); Stuart W. Wenzel, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 349 days.

(21) Appl. No.: 09/795,772

(22) Filed: Feb. 27, 2001

(65) Prior Publication Data

US 2003/0099737 A1 May 29, 2003

Related U.S. Application Data

(63) Continuation-in-part of application No. 09/781,833, filed on Feb. 12, 2001, which is a continuation-in-part of application No. 09/710,539, filed on Nov. 9, 2000, which is a continuation-in-part of application No. 09/364,788, filed on Jul. 30, 1999.

(51) Int. Cl.[7] .............................................. B29C 43/02
(52) U.S. Cl. ........................ 425/385; 425/403; 249/118
(58) Field of Search ................................ 425/175, 385, 425/403, 406; 249/118, 115; 216/2

(56) References Cited

U.S. PATENT DOCUMENTS

| 3,173,737 | A |   | 3/1965  | KinKaid et al. |         |
|-----------|---|---|---------|----------------|---------|
| 3,519,890 | A |   | 7/1970  | Ashby          |         |
| 3,649,153 | A | * | 3/1972  | Brudy          | 425/469 |
| 3,842,189 | A |   | 10/1974 | Southgate      |         |
| 3,899,154 | A | * | 8/1975  | Tanaka         | 249/117 |
| 4,516,253 | A | * | 5/1985  | Novak          | 378/34  |
| 4,553,192 | A |   | 11/1985 | Babuka et al.  |         |

(List continued on next page.)

FOREIGN PATENT DOCUMENTS

| EP | 632281     | 1/1995  |
| EP | 899538     | 3/1999  |
| JP | 58-191453  | 11/1983 |
| JP | 05-18741   | 1/1993  |
| JP | 05-198716  | 8/1993  |

(List continued on next page.)

OTHER PUBLICATIONS

"A New Wafer Probe Interface Technology Using Compliant Microsprings, A Joint Study by Teradyne, Inc. and Form-Factor, Inc.," Teradyne Formfactor White Paper (Teradyne, Inc. and FormFactor, Inc., Jan. 30, 1998), pp. 1–18.

Novitsky et al., "FormFactor Introduces An Integrated Process For Wafer–Level Packaging, Burn–in Testing, And Module Level Assembly" (FormFactor, Inc., Inc., Mar. 1999), 6 pages.

Khandros et al., "New Methods For Reducing Costs In Semiconductor Back–End,"(FormFactor, Inc., Jan. 30, 1998), 9 pages.

*Primary Examiner*—Robert Davis
*Assistant Examiner*—Thu Khanh T. Nguyen
(74) *Attorney, Agent, or Firm*—O'Melveny & Myers LLP; N. Kenneth Burraston

(57) ABSTRACT

A forming tool with one or more embossing tooth, and preferably, a plurality of such embossing teeth, arranged on a substantially planar substrate, is disclosed. Each embossing tooth is configured for forming a sacrificial layer to provide a contoured surface for forming a microelectronic spring structure. Each embossing tooth has a protruding area corresponding to a base of a microelectronic spring, and a sloped portion corresponding to a beam contour of a microelectronic spring. Numerous methods for making a forming tool are also disclosed. The methods include a material removal method, a molding method, a repetitive-stamping method, tang-bending methods, and segment-assembly methods.

38 Claims, 20 Drawing Sheets

U.S. PATENT DOCUMENTS

| | | | |
|---|---|---|---|
| 4,615,573 A | | 10/1986 | White et al. |
| 4,772,228 A | | 9/1988 | Seymour |
| 4,832,790 A | * | 5/1989 | Rossetti ............... 264/132 |
| 4,893,172 A | | 1/1990 | Matsumoto et al. |
| H842 H | | 11/1990 | Ochs |
| 5,152,695 A | | 10/1992 | Grabbe et al. |
| 5,173,055 A | | 12/1992 | Grabbe |
| 5,210,939 A | | 5/1993 | Mallik et al. |
| 5,228,861 A | | 7/1993 | Grabbe |
| 5,286,208 A | | 2/1994 | Matsuoka |
| 5,348,616 A | * | 9/1994 | Hartman et al. ............ 216/48 |
| 5,462,440 A | | 10/1995 | Rothenberger |
| 5,513,430 A | | 5/1996 | Yanof et al. |
| 5,534,784 A | | 7/1996 | Lum et al. |
| 5,555,422 A | | 9/1996 | Nakano |
| 5,576,630 A | | 11/1996 | Fujita |
| 5,599,194 A | | 2/1997 | Ozawa et al. |
| 5,613,861 A | | 3/1997 | Smith et al. |
| 5,632,631 A | | 5/1997 | Fjelstad et al. |
| 5,666,190 A | | 9/1997 | Quate et al. |
| 5,701,085 A | | 12/1997 | Malladi et al. |
| 5,810,609 A | | 9/1998 | Faraci et al. |
| 5,821,763 A | | 10/1998 | Beaman et al. |
| 5,829,128 A | | 11/1998 | Eldridge et al. |
| 5,900,350 A | * | 5/1999 | Provost et al. ............ 264/219 |
| 5,914,614 A | | 6/1999 | Beaman et al. |
| 5,944,537 A | | 8/1999 | Smith et al. |
| 5,958,469 A | * | 9/1999 | Richards ............... 425/175 |
| 5,974,662 A | | 11/1999 | Eldridge et al. |
| 6,010,609 A | * | 1/2000 | Mimura et al. ............ 264/2.5 |
| 6,014,032 A | | 1/2000 | Maddix et al. |
| 6,016,061 A | | 1/2000 | Mizuta |
| 6,029,344 A | | 2/2000 | Khandros et al. |
| 6,031,282 A | | 2/2000 | Jones et al. |
| 6,059,982 A | | 5/2000 | Palagonia et al. |
| 6,064,213 A | | 5/2000 | Khandros et al. |
| 6,072,190 A | | 6/2000 | Watanabe et al. |
| 6,183,267 B1 | | 2/2001 | Marcus et al. |
| 6,184,053 B1 | | 2/2001 | Eldridge et al. |
| 6,184,576 B1 | | 2/2001 | Jones et al. |
| 6,214,631 B1 | | 4/2001 | Burrows et al. |
| 6,255,126 B1 | | 7/2001 | Mathieu et al. |
| 6,255,727 B1 | | 7/2001 | Khoury |
| 6,289,583 B1 | | 9/2001 | Belmont et al. |
| 6,307,392 B1 | | 10/2001 | Soejima et al. |
| 6,334,960 B1 | * | 1/2002 | Willson et al. ............ 216/2 |
| 6,344,752 B1 | | 2/2002 | Hagihara et al. |
| 6,359,455 B1 | | 3/2002 | Takekoshi |
| 6,376,833 B2 | * | 4/2002 | Shimada et al. ............ 250/234 |
| 6,452,407 B2 | | 9/2002 | Khoury et al. |

FOREIGN PATENT DOCUMENTS

| | | |
|---|---|---|
| JP | 06-267408 | 9/1994 |
| JP | 07-21968 | 1/1995 |
| JP | 07-333232 | 12/1995 |
| JP | 08-306708 | 11/1996 |
| WO | WO 91/12706 | 8/1991 |
| WO | WO 96/16440 | 5/1996 |
| WO | WO 97/44676 | 11/1997 |
| WO | WO 98/21597 | 5/1998 |
| WO | WO 98/52224 | 11/1998 |
| WO | WO 99/38229 | 7/1999 |
| WO | WO 00/33089 | 6/2000 |
| WO | WO 00/33096 | 6/2000 |
| WO | WO 01/9952 | 2/2001 |

* cited by examiner

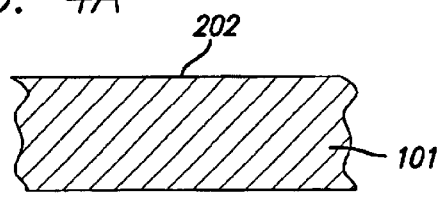
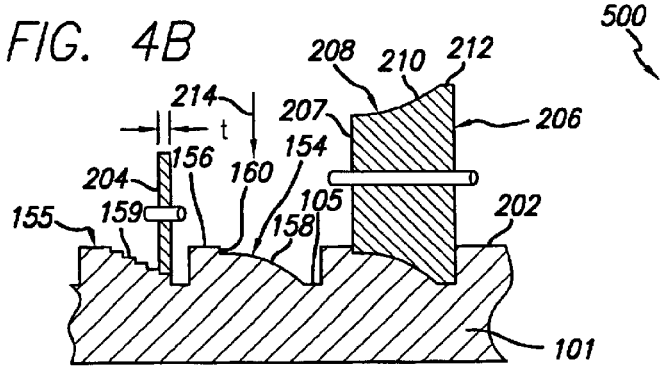
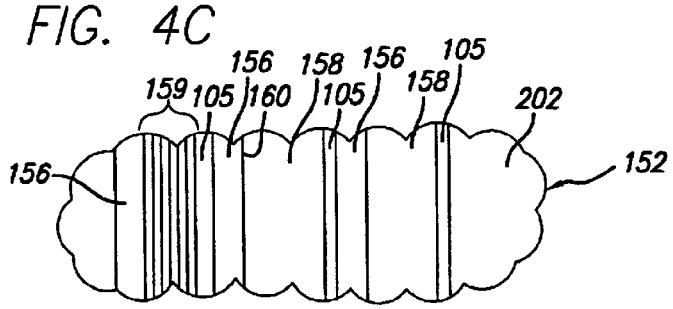
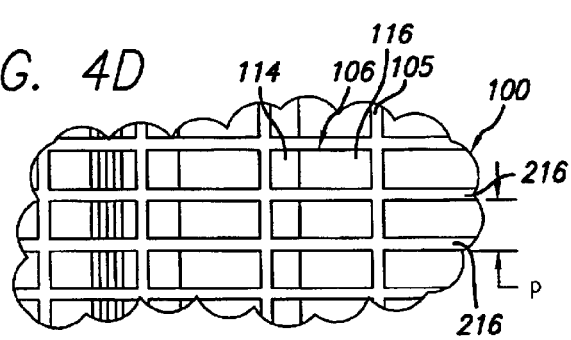
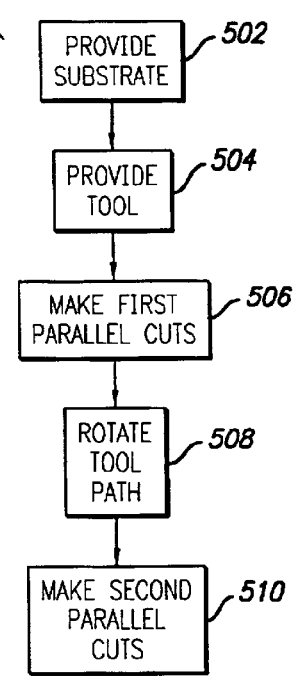

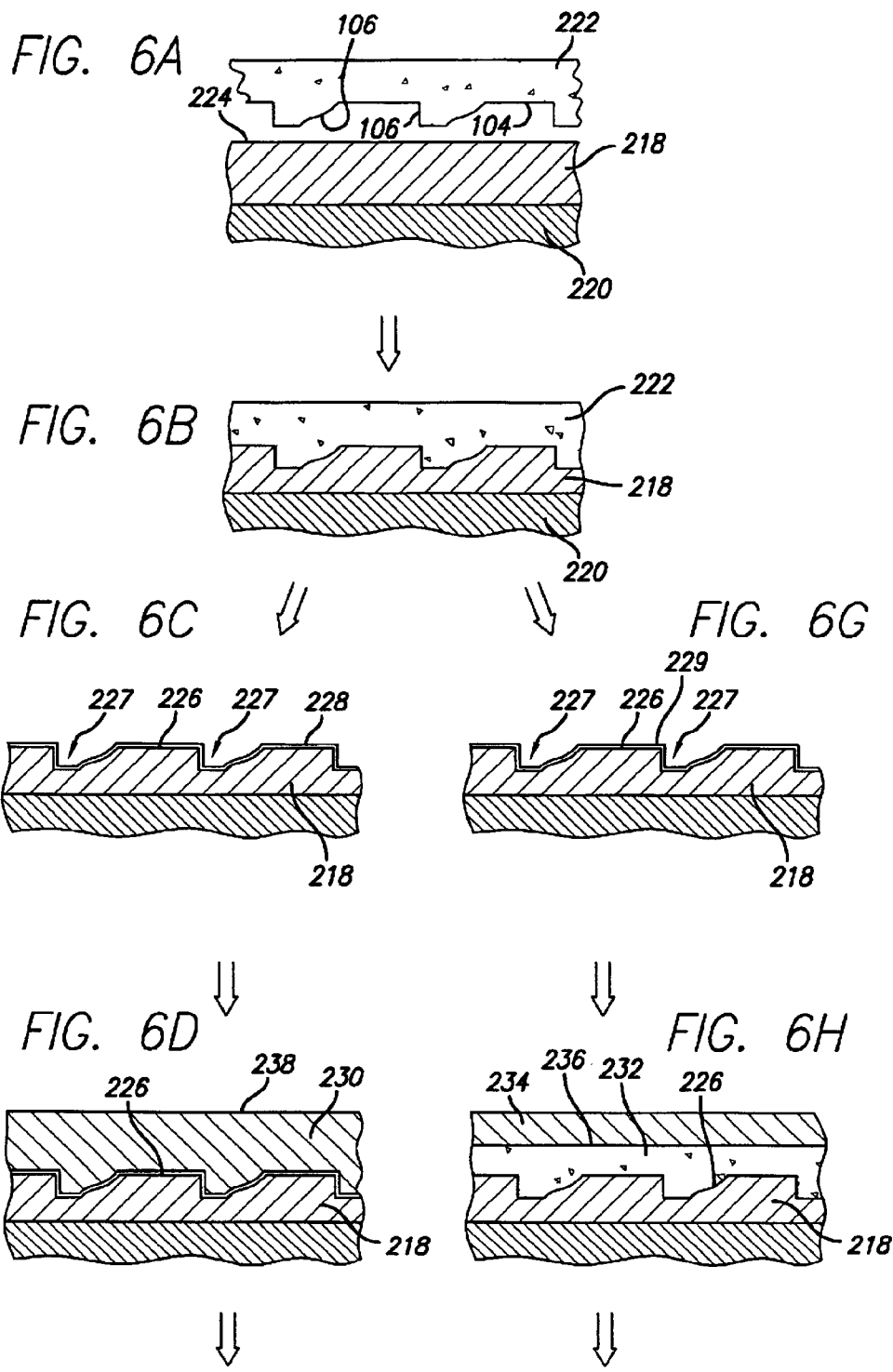

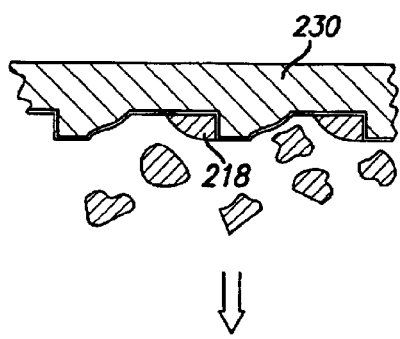
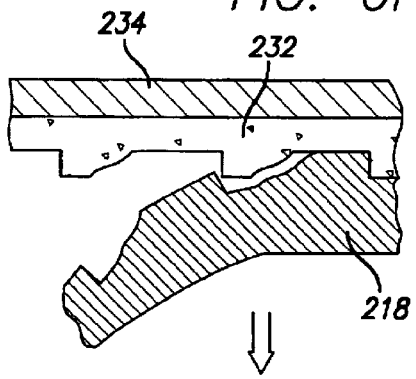
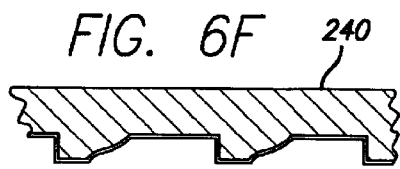
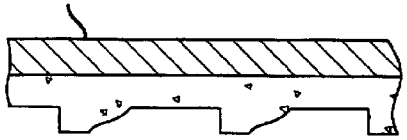
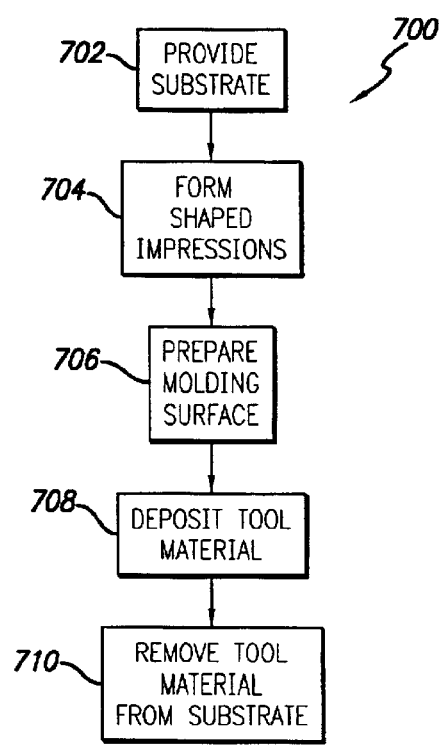

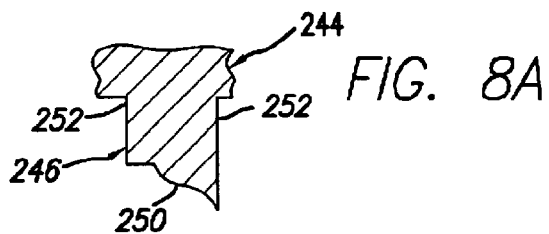
FIG. 8A
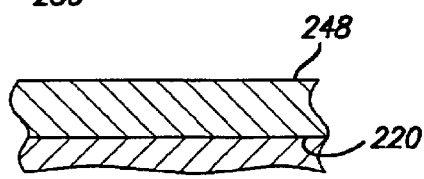
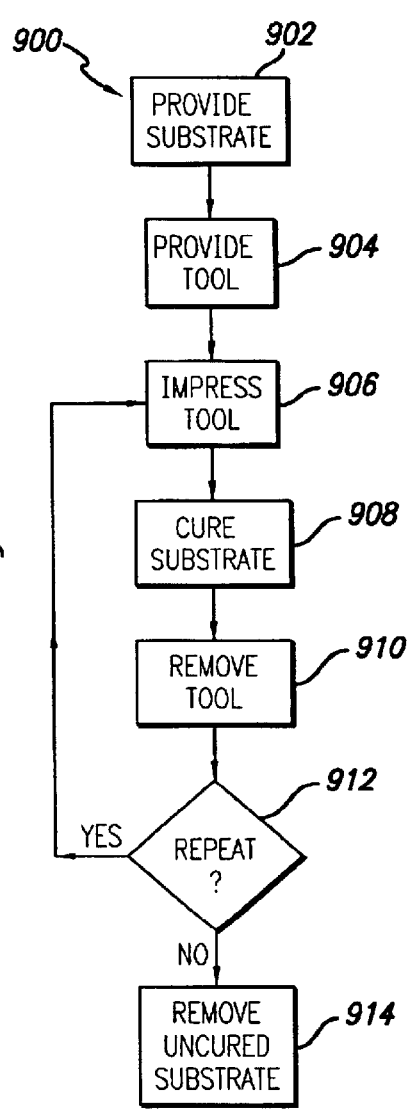
FIG. 9
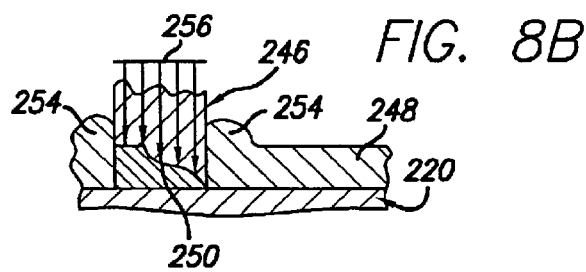
FIG. 8B
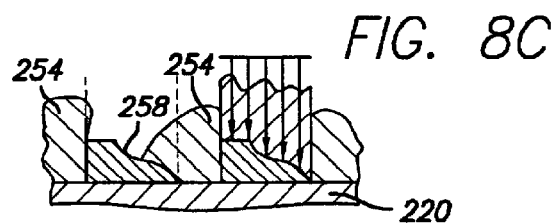
FIG. 8C
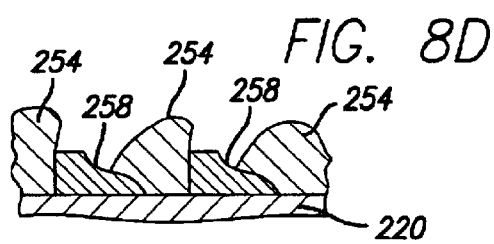
FIG. 8D
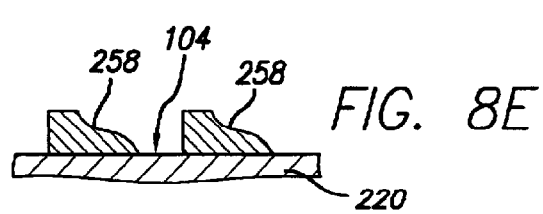
FIG. 8E

```
1302 — PROVIDE SUBSTRATE
1304 — FORM SHAPED DEPRESSIONS
1306 — TREAT SURFACE
1308 — FILL WITH LIQUID
1310 — SOLIDIFY LIQUID
1312 — PATTERN SOLIDIFIED LIQUID
1314 — DEPOSIT TOOL MATERIAL
1316 — REMOVE SUBSTRATE AND SOLIDIFIED LIQUID
```

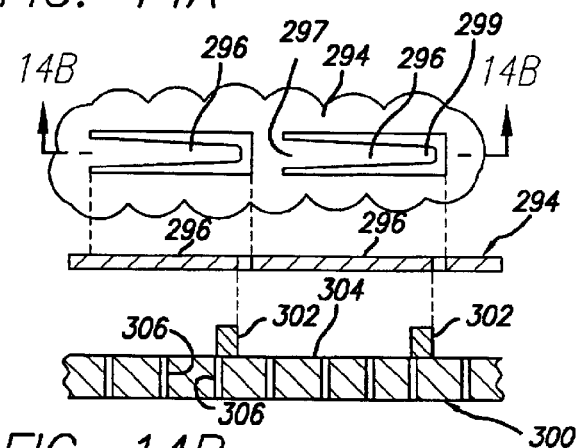
FIG. 14A
FIG. 14B
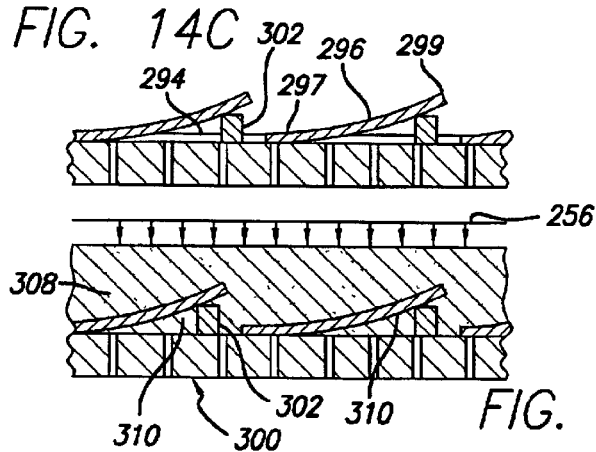
FIG. 14C
FIG. 14D
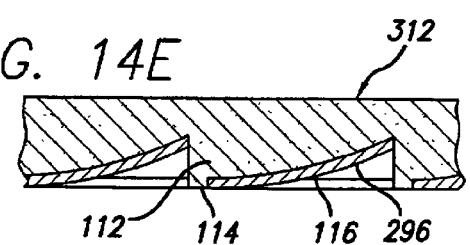
FIG. 14E
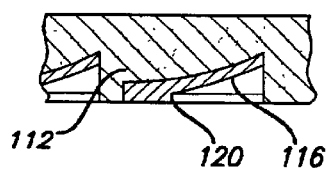
FIG. 14F
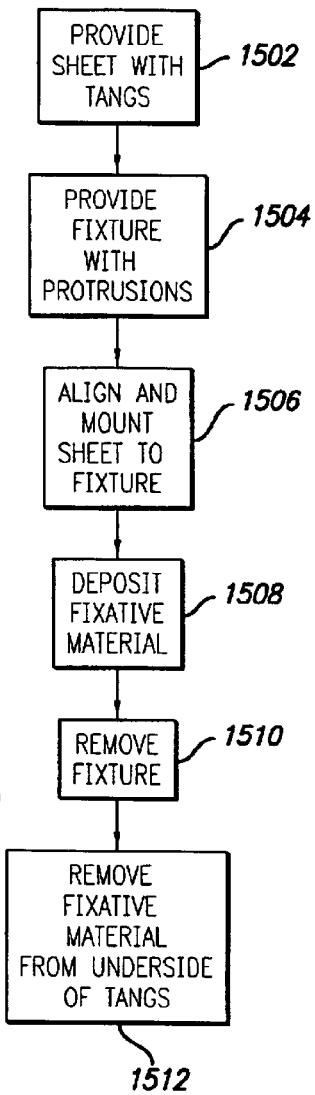
FIG. 15

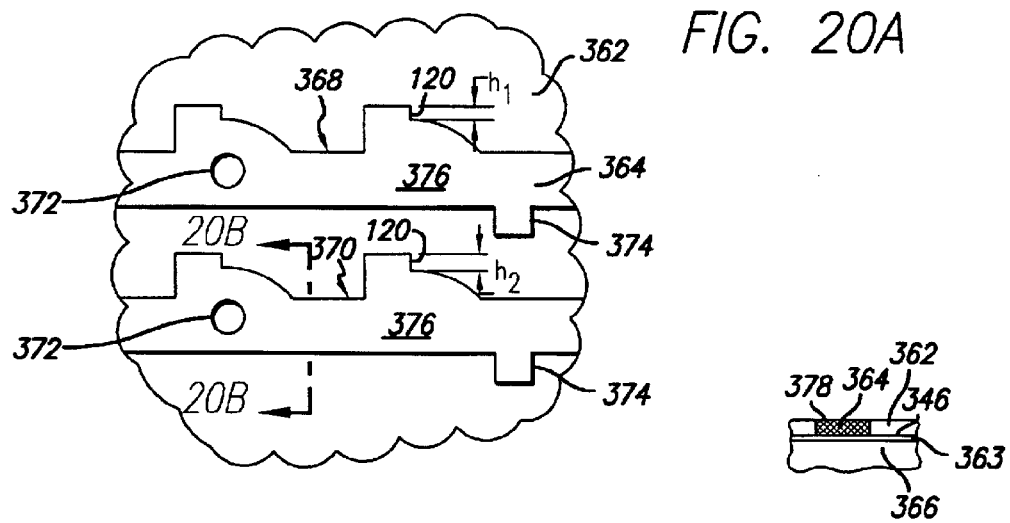
FIG. 20A
FIG. 20B
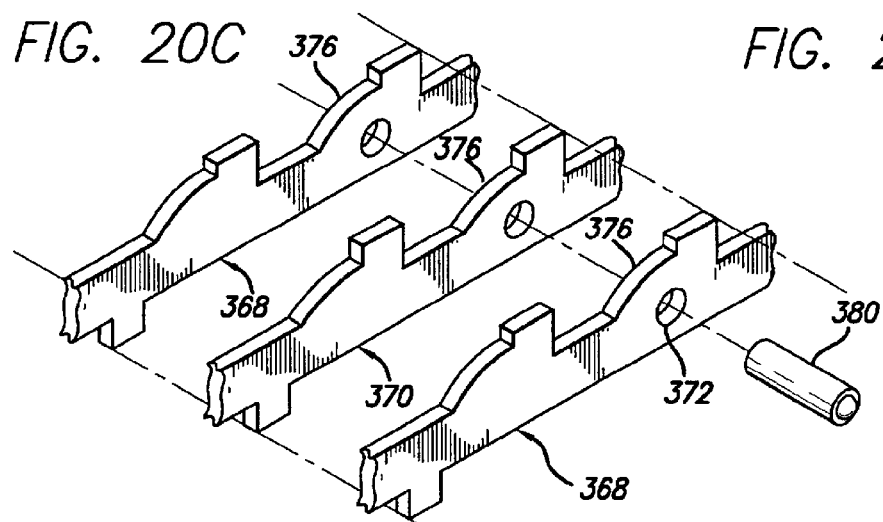
FIG. 20C
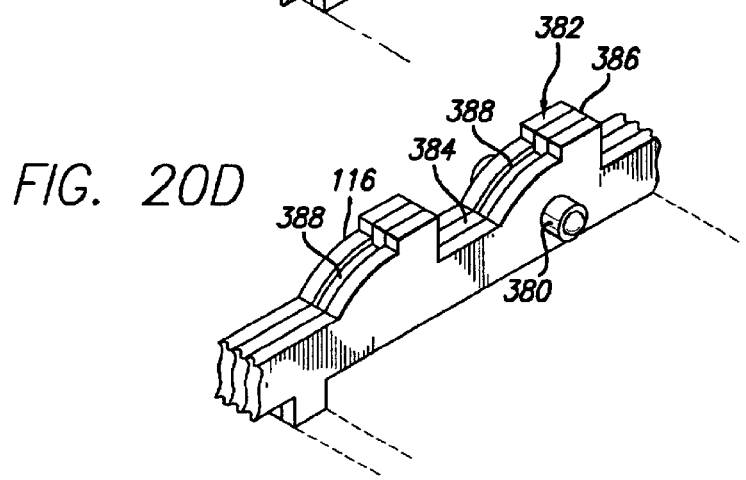
FIG. 20D

FORMING TOOL FOR FORMING A CONTOURED MICROELECTRONIC SPRING MOLD

RELATED APPLICATIONS

This application is a continuation-in-part of co-pending U.S. patent application Ser. No. 09/781,833, filed Feb. 12, 2001, entitled "METHOD FOR FORMING MICROELECTRONIC SPRING STRUCTURES ON A SUBSTRATE," by Eldridge and Wenzel, which is a continuation-in-part of co-pending U.S. patent application Ser. No. 09/710,539, filed Nov. 9, 2000, entitled "LITHOGRAPHIC SCALE MICROELECTRONIC SPRING STRUCTURES WITH IMPROVED CONTOURS," by Eldridge and Wenzel, which is a continuation-in-part of co-pending application Ser. No. 09/364,788, filed Jul. 30, 1999, entitled "INTERCONNECT ASSEMBLIES AND METHODS," by Eldridge and Mathieu, which applications are incorporated herein, in their entirety, by reference, and which are collectively referred to herein as the "parent applications."

BACKGROUND OF THE INVENTION

1. Field of the Invention

The present invention relates to tools for making electrical contact elements for electrical devices, and more particularly to forming tools for forming moldable substrates for making lithographic-scale, microelectronic spring contacts.

2. Description of Related Art

Molding, embossing, and like forming techniques have not previously been required or used in the field of semiconductor device manufacture, microelectronic spring contact manufacture, or any related area of micro-electrical-mechanical ("MEM") device manufacturing. However, new methods for forming microelectronic spring structures, as described for the first time in the parent applications referenced above, utilize a mold for a microelectronic spring structure which is contoured in a direction perpendicular to the underlying substrate. In many embodiments, the mold is formed by impressing a layer of sacrificial material with a forming tool. These new methods are well suited for making numerous microelectronic, very fine pitch spring structures in parallel, lithographic mass production processes that are readily repeatable and reproducible. After the formable sacrificial substrate is formed into a suitable mold, resilient spring material is deposited in the mold and patterned. Thus, the new methods are capable of making spring structures having various defined three-dimensional contoured shapes for providing improved spring characteristics, such as improved strength, stiffness, resistance to stress concentration cracking, and elastic range. However, to efficiently form the sacrificial substrate into the desired shape, a suitable forming tool (sometimes called a stamping tool) is needed. Given the complete lack of such tools in any related field of art, suitable tools are not currently known, nor are methods for making suitable tools. A need therefore exists for a forming tool for forming a sacrificial substrate used in the manufacture of microelectronic springs, and for a method of making such a forming tool.

SUMMARY OF THE INVENTION

The present invention provides a forming tool suitable for forming a sacrificial substrate, which may in turn be used for forming microelectronic spring structures. The present invention further provides methods for making such a forming tool.

A forming tool according the present invention is provided with one or more embossing tooth, and preferably, a plurality of such embossing teeth, arranged on a substantially planar substrate. Each embossing tooth is configured for forming a sacrificial layer to provide a contoured surface in the shape of a desired spring structure. Spring structures of the defined contoured shape may then be formed by deposition of a suitable resilient material on a sacrificial layer that has been embossed using the forming tool. Thus, a sacrificial layer may be prepared for formation of a plurality of spring structures in parallel using a forming tool with a plurality of embossing teeth.

The forming tools with contoured embossing teeth according to the present invention are suitable for forming sacrificial substrates for making springs with numerous performance improvements. For example, forming tools according to the present invention may be used to readily form spring structures having a U-shaped cross-section, a V-shaped cross-section, and/or a rib running along a length of the spring. These contoured shapes, and the advantages provided thereby, are described in the co-pending application Ser. No. 09/710,539, referenced above.

Various methods for making a forming tool according to the present invention are provided. In one embodiment, a relatively hard substrate is selected and the embossing teeth are defined by selective removal of material from the substrate. Various methods may be used to selectively remove material, including laser ablation, mechanical milling using a precision diamond saw, and gray-scale lithography using photo-patternable glass. The hard substrate with embossing teeth may be used directly as an embossing tool.

Alternatively, the hard substrate may be used to form a reusable mold for producing a plurality of identical forming tools, thereby reducing costs associated with selective material removal. In this embodiment, the hard substrate is used to form shaped impressions corresponding to the embossing teeth in a moldable layer. A layer of tool material is then deposited in the molded layer. The tool material may be a relatively hard material such as a nickel or nickel alloy, a relatively soft material such as an organic polymer, or a UV transparent material such as SU-8. The molded layer is then removed from the layer of tool material to produce the forming tool. In some embodiments, the molded layer may be reused to mold another forming tool. Alternatively, the molded layer is destroyed after each use.

In another embodiment, a method for making a forming tool using the properties of a liquid meniscus is provided. First, a layer of material is formed over a substrate. Then, a recess is developed in the material, and liquid is provided in the recess to form a meniscus. The liquid is cured or hardened to stabilize the contoured shape of the meniscus. The stabilized meniscus is then used to mold an embossing tooth of a forming tool, as described above. A spring structure deposited on a sacrificial substrate that has been formed with the embossing tooth will take on the shape of the liquid meniscus.

In another embodiment of a method for making a forming tool, a thin metal sheet is etched to define a plurality of cantilevered metal tangs having the projected shape of the desired spring structures in plan view. The sheet is adhered to a planar substrate and a free tip of each tang is uniformly deflected away from the substrate using a precisely positioned spacer. A stabilizing fill material is then used to hold the thin sheet in place with the tangs in their deflected position, and the substrate is removed. The fill material is selectively removed to define embossing teeth for a forming tool. Removal of fill material underneath the tangs yields a stabilized sheet that may be used directly as a forming tool, or as a plug for making a forming tool mold. Alternatively, removal of fill material above the tangs yields a mold that may be used to form a forming tool as described above.

In another embodiment of a method for making a forming tool, thin metal tangs of bimetallic or other pre-stressed material are deposited on a substrate using a lithographic process, in the desired spring shape. Each tang is adhered to the substrate at one end. Application of heat or other method is used to create a stress gradient across the thickness of the tang, causing the tangs to bend away from the substrate at their free ends, defining contoured spring shapes. A stabilizing fill material is applied to stabilize the tangs in their contoured shape. The fill material is selectively removed to define a forming tool, or a mold for a forming tool, as previously described.

In another embodiment of a method for making a forming tool, an embossing tooth is fabricated from a UV transparent material, preferably by a lithographic process. The tooth is freed from the surrounding material and attached to a UV transparent material, such as the end of a light guide. The tooth is then used to mold contoured surfaces in a layer of UV curable material on a substrate. After each contoured surface is molded, it is cured by exposure to UV light. After a desired number of contoured surfaces have molded and cured, the uncured portions of the layer of UV curable material are removed from the substrate. The resulting substrate with cured contoured surfaces is then used to mold a forming tool, as previously described.

In another embodiment of a method for making a forming tool, thin plates or layers of material are patterned in the shape of cross-sections of a forming tool. The material may be a metal, a UV transparent material such as SU-8, or any other patternable material of sufficient strength. The patterning may be done by a precision machining method such as laser ablation, or by a photo-lithographic and etching process. The layers or plates are stacked in the desired sequence and fastened together to form a section of a forming tool. Additional sections may similarly be assembled together to form a forming tool, or plug mold for making a forming tool, as previously described.

A more complete understanding of the forming tool and method for making the same will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

FIGS. 4A–4B are cross-sectional views of a tool material during exemplary steps of a material removal method for making a microelectronic spring mold forming tool according to the invention.

FIGS. 4C–4D are plan views of a tool material during exemplary steps of a material removal method for making a microelectronic spring mold forming tool according to the invention.

FIG. 5 is a flow diagram showing exemplary steps of a material removal method for making a microelectronic spring mold forming tool according to the invention.

FIGS. 6A–6J are cross-sectional views of a molding substrate and related materials during exemplary steps of plug-and-mold methods for making a microelectronic spring mold forming tool according to the invention.

FIG. 7 is a flow diagram showing exemplary steps of a plug-and-mold method for making an microelectronic spring mold forming tool according to the invention.

FIGS. 8A–8E are cross-sectional views of a molding substrate and related materials during exemplary steps of a repetitive stamping method for making a microelectronic spring mold forming tool according to the invention.

FIG. 9 is a flow diagram showing exemplary steps of a repetitive stamping method for making a microelectronic spring mold forming tool according to the invention.

FIG. 14A is a plan view of a thin sheet having tangs for use in a sheet bending method for making a microelectronic spring mold forming tool.

FIGS. 14B–14F are cross-sectional views of a fixture, sheet with tangs, and fixative material during exemplar steps of a sheet bending method for making a microelectronic spring mold forming tool.

FIG. 15 is a flow diagram showing exemplary steps of a sheet bending method for making a microelectronic spring mold forming tool.

FIG. 20A is a plan view of a patterned layer of tool material during an exemplary step of a segment-assembly method for making a microelectronic spring mold forming tool.

FIG. 20B is a cross-sectional view of a patterned layer of tool material during an exemplary step of a segment-assembly method for making a microelectronic spring mold forming tool.

FIG. 20C is an exploded assembly diagram showing components of an exemplary forming tool according to a segment-assembly method for making a microelectronic spring mold forming tool.

FIG. 20D is a perspective view of a portion of an exemplary microelectronic spring mold forming tool made according to a sectional assembly method.

DETAILED DESCRIPTION OF THE PREFERRED EMBODIMENT

The present invention satisfies the need for a forming tool for forming microelectronic spring molds, and methods for making such a forming tool. In the detailed description that follows, like element numerals are used to describe like elements illustrated in one or more figures.

Figure 1A:
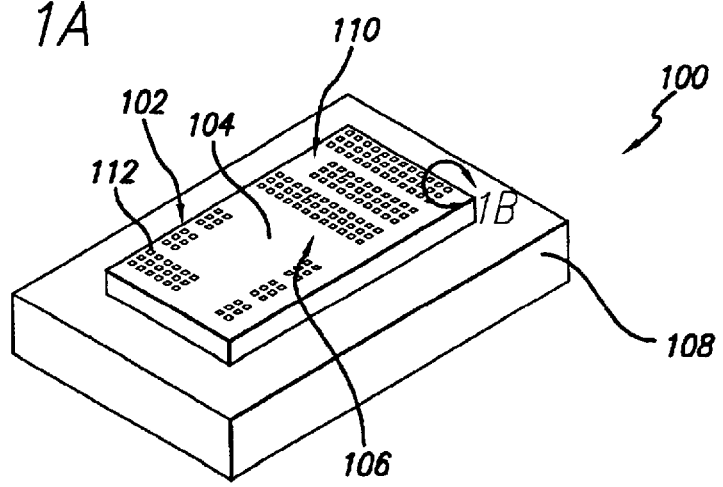
FIG. 1A is a perspective view of an exemplary chip-level forming tool according to the invention.

An exemplary chip-level forming tool 100 is shown in FIG. 1A. Forming tool 100 comprises a base 102 comprised of a tool material. The tool material may be any material which is sufficiently hard, strong, and formable on the desired scale. A wide variety of materials are suitable; however, for use with the methods disclosed herein, preferred materials include metals such as nickel, steel, or aluminum; relatively hard plastics such as polyamides, polyimides, and epoxies; formable nonmetallic inorganic materials such as glass and fused silica; and selected photoresist materials such as SU-8. In an embodiment of the invention, the tool material is provided with microscopic pores to remove gas that may become trapped between the forming tool and the molding substrate during a stamping operation. Such pores may be provided by fabricating the forming tool out of a porous material such as a Micropore™ glass filter or glass frit. Pores may also be individually machined (such as by laser ablation) at the locations where gases are most likely to become trapped. A smooth, gas-permeable membrane such as Gore-Tex™ can also be applied over a porous surface to increase lubricity and act as a release agent during molding operations. To reduce or eliminate the need for pores and gas permeability, the forming tool is preferably applied in a low vacuum environment.

Base 102 comprises an embossing face 104 on which a contoured embossing surface 110, comprising at least one embossing tooth 112, is disposed. In an embodiment of the invention, a plurality of embossing teeth 106 are disposed on embossing face 104, as shown in FIG. 1A. Each embossing tooth 112 of teeth 106 is configured to form a mold for a freestanding resilient microelectronic spring when tool 100 is impressed into a layer of moldable material. In an embodiment of the invention, each tooth 112 of the plurality of teeth 106 has a substantially identical surface contour, corresponding to a molding surface for a microelectronic spring mold. The teeth 106 may be arranged in a rectangular array, or in any pattern desired on face 104. Teeth 106 may be made substantially identical to each other, or may comprise various different shapes on the same forming tool 100, depending on the desired spring structures to be formed.

Although embossing face 104 is shown as being substantially planar underneath teeth 106, face 104 may be provided with non-planar features adjacent to teeth 106, so long as any such non-planar features do not interfere with the molding function of teeth 106. For example, embossing face 104 may be provided with recesses, streets, or through holes (not shown) interspersed between individual ones of teeth 106, for receiving excess mold material, i.e., flash, when tool 100 is impressed into a layer of such material. For further example, embossing surface 110 may be provided with protruding tooling stops or raised seals (not shown) adjacent to a periphery of the embossing face 104. Such auxiliary features, whether recessed or protruding, may be used to enhance the molding function of tool 100, but do not alter the essential function of embossing face 104 and embossing surface 110 thereon, which is to form a mold for one or more freestanding resilient microelectronic springs. Base 102 is optionally mounted to a support substrate 108 for assembly into a multi-faceted forming tool assembly, or for mounting to a stamping jig or stamping equipment.

In some embodiments of the invention, base 102 and embossing face 104 may be contoured to conform to a curved surface, such as a cylindrically curved surface. For example, base 102 may comprise a relatively thin flexible material that can be mounted to the curved surface of a cylindrical roller. In the alternative, base 102 may comprise a cylindrical roller upon which the embossing face 104 and embossing surface 110 are formed, for example, by adapting a selected one of the techniques described herein. A forming tool having an embossing face 104 that conforms to a cylindrically curved surface is particularly useful for rolling over the surface of a moldable surface. Depending on the characteristics of the molding substrate, desired shape of the mold, available manufacturing equipment, and so forth, a continuous rolling molding operation may offer advantages as compared to a sequential, reciprocating-type stamping operation. It should further be apparent that the details, features and methods described herein are, in general, equally applicable to forming tools with curved bases and embossing faces, or may readily be adapted thereto by one of ordinary skill in the art.

In some embodiments of the invention, the forming tool 100 is provided with means for controlling its temperature. For example, the base 102 may be provided with at least one channel for containing a thermal control fluid, having an inlet port and an outlet port for flow of the thermal control fluid. Various thermal control fluids may be used, such as, for example, various commercially available refrigerants for applications wherein the tool is to be cooled, or heat transfer oils for applications wherein the tool is to be heated. In the alternative, the base 102 may comprise a relatively high thermal mass of material that is maintained in a temperature controlled environment, such as in a bath of temperature-controlled fluid, between applications. Yet other alternatives for heating include electrical resistive heaters embedded in, or attached to, forming tool 100. It should be appreciated that, for some applications, it is particularly useful to maintain the forming tool at a lower-than-ambient temperature. For example, a cooled forming tool may facilitate higher throughput in applications where the molded substrate is cooled for purposes of stabilizing or hardening the substrate. For still other applications, it may be desirable to vary the temperature of the forming tool during the forming process. For example, a tool may be heated to soften the moldable substrate, and then cooled after the desired features are molded, to facilitate hardening of the moldable substrate and/or removal of the tool. For such applications, it may be desirable to provide a tool having a relatively low thermal mass for more rapid cycle times.

Figure 1B:
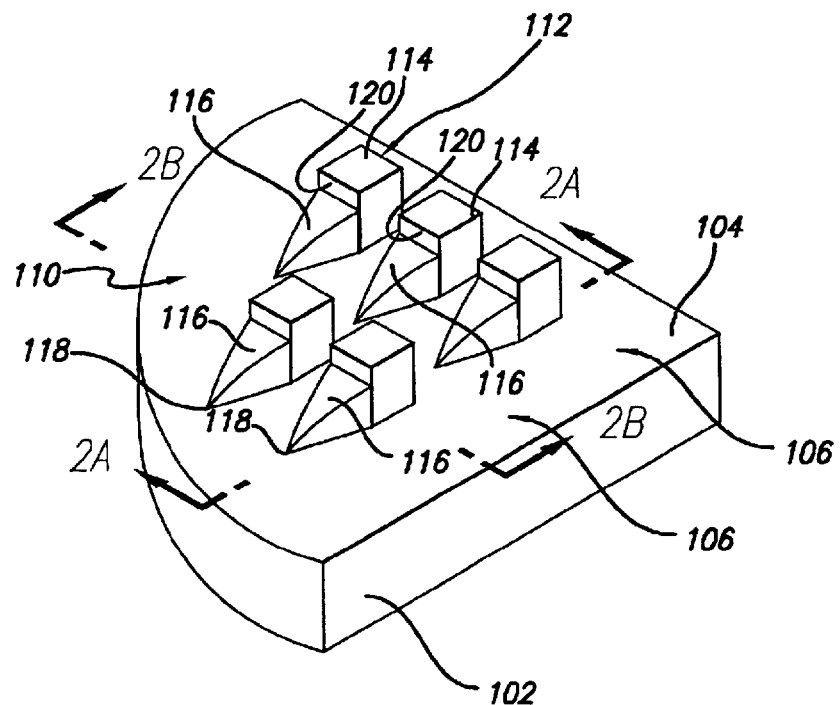
FIG. 1B is a detail perspective view of a portion of the forming tool shown in FIG. 1A, showing an embodiment with protruding embossing surfaces.

Details of forming tool 100 are shown in FIG. 1B. Each tooth 112 comprises a protruding area 114 and a sloped portion 116 receding from the protruding area 114. Sloped portion 116 is configured to form a beam portion of a mold for a free-standing microelectronic spring, and defines the contoured shape of the beam. In some embodiments of the invention, sloped portion comprises a contour in a length direction, such as an S-curve, a convex curve, a concave curve, or a sinusoid. For example, FIG. 1B shows each tooth 112 with a sloped portion 116 comprising a convex contour. Protruding area 114 is configured to form a base portion of a mold for a freestanding microelectronic spring, which is the area where the base of the spring is to be formed. A step 120 is optionally provided to vertically offset the sloped portion 116 from area 114. Alternatively, sloped portion 116 is blended smoothly into area 114, depending on the desired spring shape.

In a typical embodiment of the invention, each protruding area 114 is substantially planar, comprises a maximally protruding portion of each tooth 112, and is aligned in the same plane as adjacent protruding areas 114 of adjacent teeth 106, as shown in FIG. 1B. This configuration is preferred for forming base portions of molds on substantially planar substrates. Similarly, in a typical embodiment, each distal end 118 of sloped portions 116 is aligned in the same plane as adjacent distal ends 118, to form molding surfaces for spring structures with co-planar tips. However, for providing spring molds for non-planar substrates, protruding areas 114 and distal ends 118 may be configured to not be co-planar with corresponding portions of adjacent teeth 106.

Various exemplary configurations for molding teeth are described in the specification that follows. It should be appreciated that the invention is not limited to the particular shapes disclosed herein, and encompasses any molding tool for forming a mold for a resilient freestanding microelectronic spring. In addition, the invention encompasses forming tools having teeth with various different shapes, as well as tools having only identical teeth on the embossing surface. It should further be appreciated that a forming tool may be configured to function as one of two or more forming tools for successive application to a molding substrate, without departing from the scope of the invention.

Figure 1C:
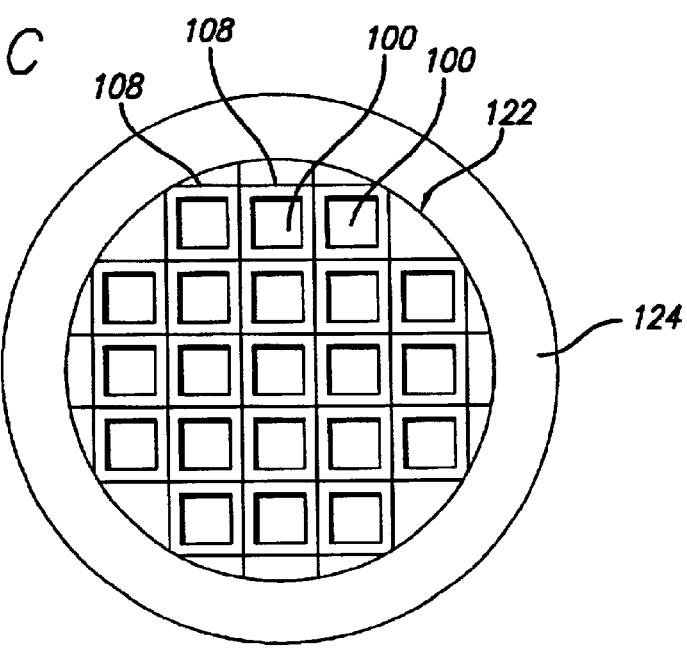
FIG. 1C is a plan view of an exemplary wafer-level forming tool.

Chip-level forming tools, such as shown in FIG. 1A, may be assembled into larger tool assemblies, such as the wafer level forming tool shown in plan view in FIG. 1C. Each forming tool 100, optionally mounted to a support substrate 108, is arranged on an assembly substrate 124 to form wafer-level tool 122. Typically, individual forming tools 100 are arranged in a rectangular array on substrate 124, with one tool 100 corresponding to one die on a wafer. In this configuration, a plurality of microelectronic spring molds may be formed in parallel (that is, during a single process) on all dice, or a selected portion of dice, on a semiconductor wafer. It should be apparent that various configurations of individual forming tools 100 may be assembled in various arrangements, without departing from the scope of the invention. For example, a single tool 100 may be configured to form spring molds on more than one die at a time. For further example, a wafer lever tool 122 may be configured to contact only a portion of dice on a wafer. Assembly of a larger forming tool, such as wafer-level tool 122, from individual units, such as chip-level tool 100, provides advantages associated with assemblies, such as greater versatility, ease of repair, and higher yield. However, a wafer-level forming tool may also be formed out of an integrated piece of tool material, if desired.

Figure 1D:
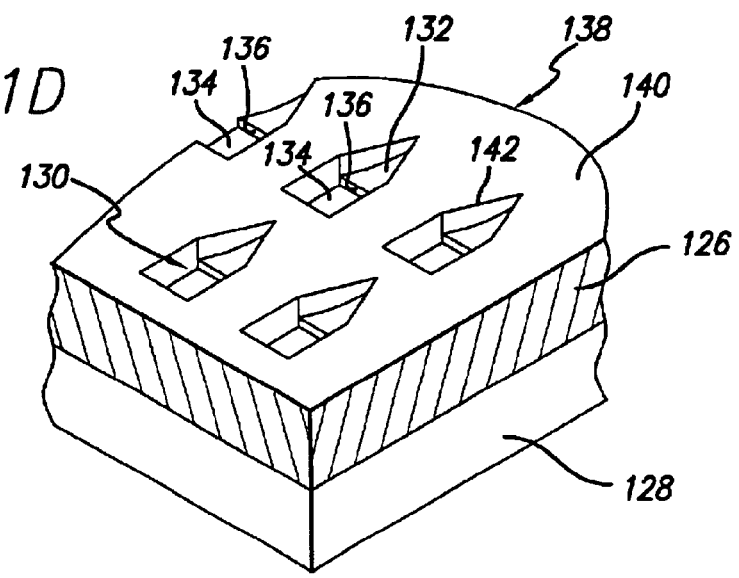
FIG. 1D is a detail perspective view of a typical impression made by the tool shown in FIG. 1B in a moldable substrate.

FIG. 1D shows a partial perspective view of a layer of moldable material 126 after being impressed with a forming tool such as the tool shown in FIG. 1A. A plurality of molds for microelectronic springs, such as mold 130, have been formed in a surface 140 of moldable layer 126. Each mold 130 comprises a beam molding surface 132, for a beam of a microelectronic spring, and a base molding surface 134, which preferably comprises an exposed surface of the underlying, relatively hard and non-moldable substrate 128. Alternatively, the base molding surface 134 is adjacent to the surface of substrate 128, and a portion of moldable layer 126 is removed under base molding surface 134 in a subsequent step. Each mold 130 optionally includes a stepped portion 136, corresponding to an optional step, such as step 120 shown in FIG. 1B, on tooth 112. The forming tool 100 is comprised of a material harder than moldable layer 126, and is preferably coated with, or comprised of, a material that will not adhere to layer 126, so that the forming tool may be cleanly removed after molding. Where molds 130 are recessed into the mold material, as shown in FIG. 1B, each mold 130 is provided with a lip 142. Lip 142 may be flush with the side walls of recessed mold 130 (as shown); alternatively, lip 142 may overhang the side walls. Molds 130 are suitable for forming microelectronic spring structures, as further described in the co-pending parent applications referenced above.

Figure 1E:
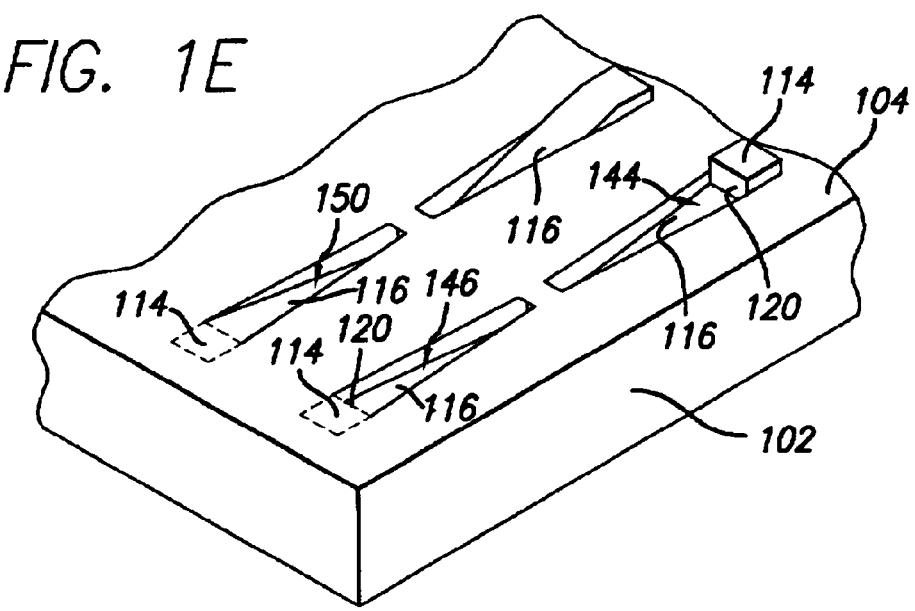
FIG. 1E is a detail perspective view of a portion of a forming tool, showing an embodiment with recessed embossing surfaces.

The molding surfaces (comprising protruding area 114 and sloped portion 116) of an embossing tooth do not necessarily protrude from the embossing face 104 of forming tool 100. That is, a portion or all of the molding surfaces may be disposed at, or recessed below, the embossing face 104, as shown in FIG. 1E. Four different exemplary configurations of such recessed teeth are shown in FIG. 1E. It should be appreciated that, in practice, a single tooth shape, or various different tooth shapes, may be used on any particular tool, depending on the requirements of the application. Tooth 144 has a sloped portion 116 recessed below a surface of embossing face 104, a stepped portion 120, and a protruding area 114 protruding from the surface of embossing face 104. In comparison, tooth 146 has a sloped portion 116 also recessed below a surface of embossing face 104 and a stepped portion 120, but protruding area 114 is co-planar with the surface of embossing face 104. That is, in tooth 146, protruding area 114 is protruding relative to the sloped portion 116, but not relative to the surface of the embossing face 104. Tooth 148 is similar to tooth 144, but lacks a step 120, so sloped portion 116 blends smoothly with protruding area 114. Tooth 150 is similar to tooth 146 in that its protruding area 114 is also co-planar with the surface of embossing face 104, but like tooth 148, tooth 150 lacks step 120.

Figure 1F:
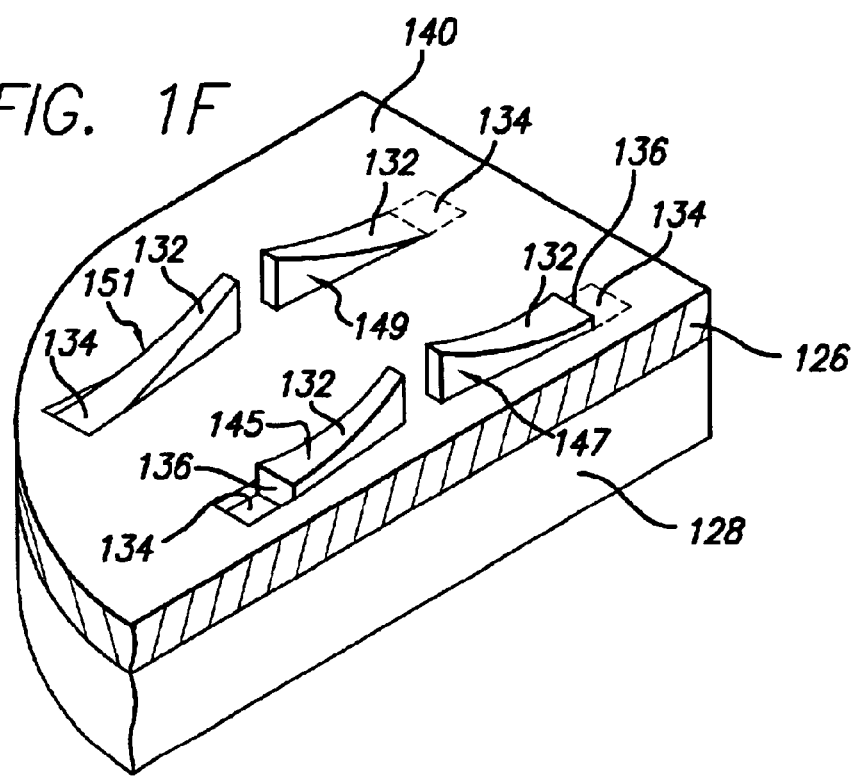
FIG. 1F is a detail perspective view of a typical impression made by the tool shown in FIG. 1E in a moldable substrate.

FIG. 1F shows exemplary microelectronic spring molds formed by impressing teeth of the type shown in FIG. 1E into a layer of moldable material 126 on substrate 128. Mold 145 is formed by tooth 144, and comprises a beam mold 132, a stepped portion 136, and a base mold 134 recessed below a surface 140 of the moldable layer 126. Mold 147 is formed by tooth 148, and comprises a beam mold 132, a stepped portion 136, and a base mold portion 134 co-planar with surface 140. Mold 149 has a base mold portion 134 co-planar with surface 140, and a beam mold 132 blended with the base mold 134, thereby lacking a stepped portion. Mold 151 also has blended beam and base molds 132 and 134, with its base mold portion 134 recessed below surface 140. It should be apparent that each of molds 145, 147, 149, and 151 is suitable for molding a microelectronic spring structure as disclosed in the co-pending parent applications referenced above.

Figure 1G:
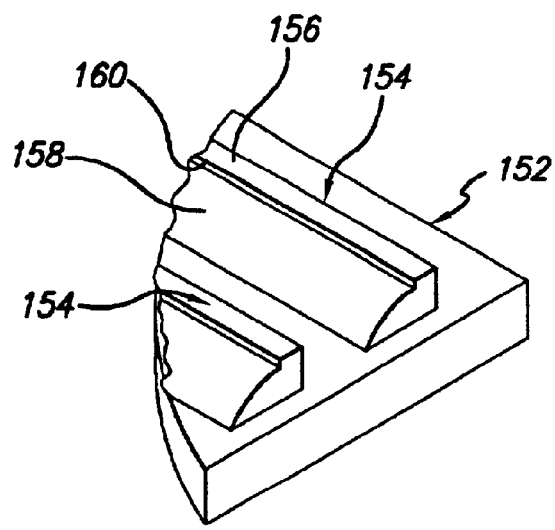
FIG. 1G is a detail perspective view of a portion of a forming tool, showing an embodiment with protruding, continuous embossing surfaces.
Figure 1H:
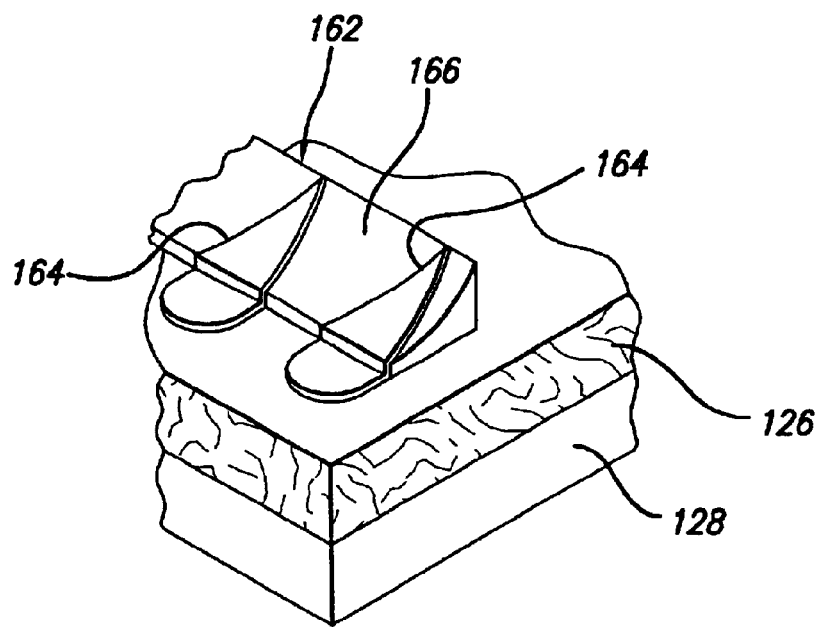
FIG. 1H is a detail perspective view of an impression made by a tool with recessed, continuous embossing surfaces, and the use of patterned spring material to define discrete structures on a continuous molding surface.

In an embodiment of the invention, a single molding tooth is configured to form a mold that may be used to form a plurality of similar microelectronic spring structures at the same time. An exemplary tooth for plural structures according to this embodiment is shown in FIG. 1G. A plurality of teeth such as tooth 154 may be disposed on a forming tool 152. Tooth 154 has an elongated protruding area 156, an elongated sloped portion 158, and optionally includes an elongated step 160. When impressed into a layer of moldable material 126, forming tool 152 will create an elongated mold suitable for forming plural spring structures. An exemplary elongated mold 166 is shown in FIG. 1H. Elongated mold 166 exemplifies a shape formed by a tooth of the recessed type, exemplified by tooth 146 in FIG. 1E, if the recessed tooth is elongated in a manner similar to the elongated protruding tooth 154 shown in FIG. 1G. Plural spring structures may be formed on mold 166, by deposition of patterned resilient spring material 164 to define discrete structures, as further described in the co-pending parent applications referenced above. An advantage of elongated teeth, such as tooth 154, is potentially lower manufacturing cost, without any adverse impact on the manufacturing of molded spring structures, depending on the manufacturing processes selected.

Figure 1I:
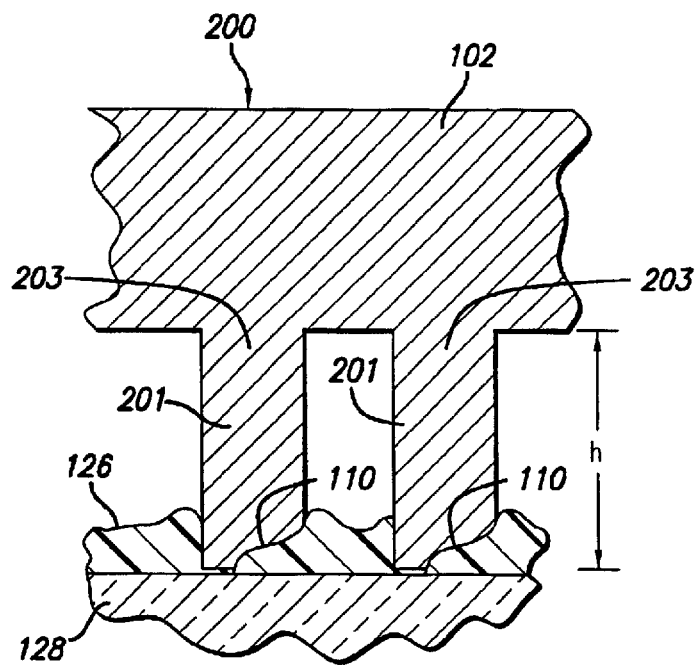
FIG. 1I is a cross-sectional view of a portion of an exemplary forming tool, having elongated teeth for decreasing the thermal response time of the tool.

In an alternative embodiment, the embossing teeth are elongated in height, that is, protrude from the base 102 of the forming tool a greater distance than necessary for embossing purposes. FIG. 1I shows an exemplary forming tool 200 having elongated-height embossing teeth 201, here shown fully impressed into moldable layer 126 on substrate 128. Height "h" of tooth 201 is substantially greater than needed to accommodate the thickness of layer 126. The substantially elongated teeth comprise a means for decreasing the thermal response time of tool 200. One reason to provide excess height is to thermally isolate the teeth 201, especially at their distal ends, from base 102, which may have a relatively high thermal mass. With careful design, the teeth can thus be made to thermally respond in a way that facilitates a repetitive, mass-production stamping process. For example, a tooth can be heated to soften the moldable substrate for molding, then rapidly cooled for removal from the substrate, and rapidly re-heated for the next cycle.

Figure 1J:
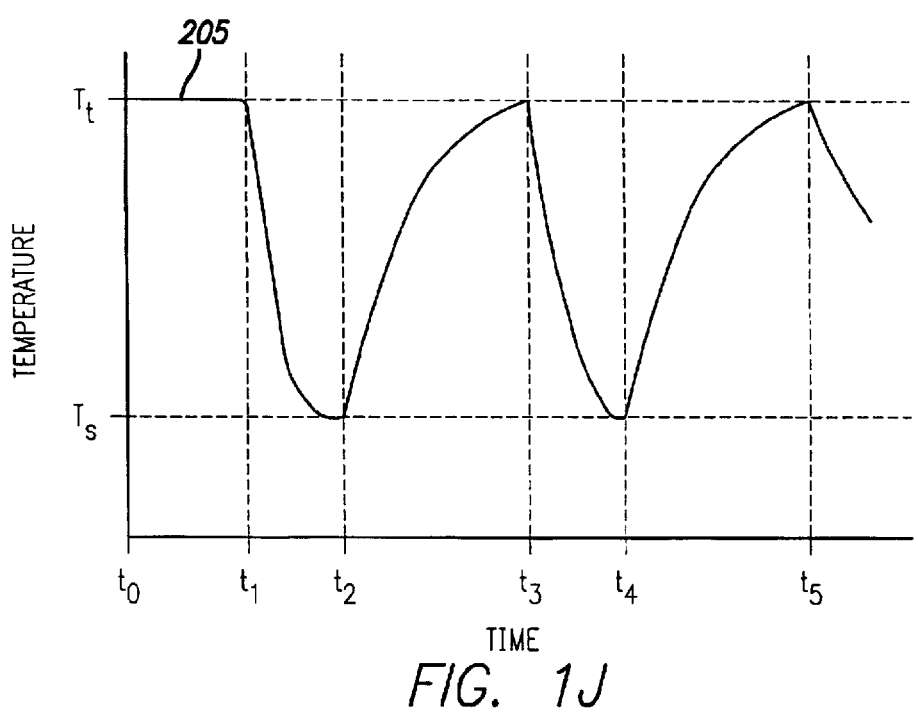
FIG. 1J is a chart of an exemplary temperature cycle for a forming tool, showing an exemplary effect of decreasing the thermal response time of a tool.

An exemplary temperature response of a tooth 201 of tool 200 is shown in FIG. 1J. The forming tool 200 is maintained at a controlled temperature "$T_t$," such as, for example, about 200° C., using a known temperature control method. The temperature of the moldable substrate 126 is held at a roughly constant average temperature "$T_s$," such as, for example, about 100° C. Temperature curve 205 represents a typical temperature of molding tooth 201, taken at a point adjacent to embossing surface 110, at various times during an embossing process. Prior to making an impression (between time $t_0$ and $t_1$), tool 200 is maintained at a uniform temperature $T_t$. At time $t_1$, tool 200 is impressed into the moldable layer 126 and held in position until time $t_2$, such as for about ten seconds. The surface 110 of tooth 201 cools rapidly upon being impressed into layer 126. The thermal response (rapidity of temperature change) of tooth 201 is preferably enhanced by a low thermal mass, a small area for heat conduction through the root 203 of the tooth, and a long conduction path for heat flow from base 102 to surface 110 caused by the relatively large tooth height h. At the same time, the temperature of the base 102 is relatively constant because of its large thermal mass and isolation from cooler layer 126. By time $t_2$, the surface temperature of tooth 201 has approached equilibrium with the average substrate temperature $T_s$, and the tool 200 is removed from the moldable substrate. The tooth surface temperature then increases until it approaches the tool base temperature $T_t$ at time $t_3$, at which time the cycle may be repeated.

An alternative means for decreasing the thermal response time of tool 200 comprises making the entire forming tool, including base 102, with a low thermal mass. An exemplary thermally responsive tool may be configured as shown in FIG. 6J, wherein the layer 232 comprises a relatively low mass of conductive material, and reinforcement backing 234 is a thermal insulator. Various other features and configurations may be provided to enhance the thermal response of a forming tool, as should be apparent to one skilled in the art.

Figure 2A:
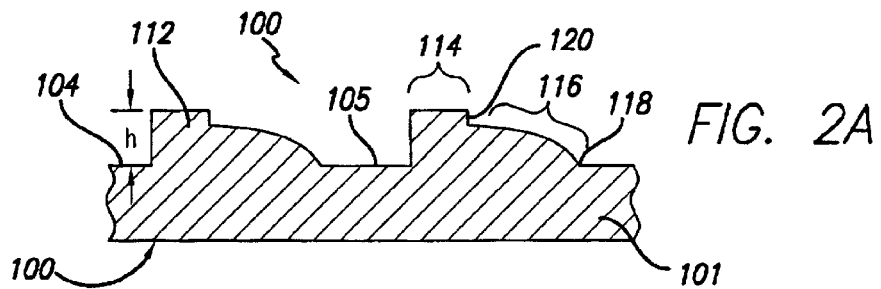
FIG. 2A is a cross-sectional view of a portion of an exemplary forming tool, showing the profile of exemplary embossing surfaces along a length thereof.

Further views of exemplary embossing teeth for use with a forming tool according to the invention, and various exemplary shapes of embossing teeth, are shown in FIGS. 2A–2I and FIGS. 3A–3F. FIG. 2A shows a cross-sectional view of two embossing teeth 112, taken in the length direction indicated by arrows 2A in FIG. 1B. The profile of the embossing surface 110 in a length direction is visible in this view. In the example shown, protruding area 114 is substantially parallel to a planar surface 105 of the embossing face 104, and sloped region 116 is contoured in a length direction. Tooth 112 protrudes from surface 105 for a height "h," defined as the vertical distance between the distal end 118 of sloped portion 116 and the upper surface of protruding area 114. In embodiments of the invention, it is preferable to contour the surface of sloped region 116 in one or more directions, as further described in the co-pending parent applications referenced above.

Figure 2B:
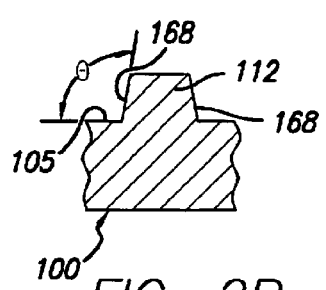
FIG. 2B is a cross-sectional view of a portion of an exemplary forming tool, taken across the width of an exemplary protruding embossing surface, according to an embodiment of the invention having beveled embossing teeth.
Figure 2C:
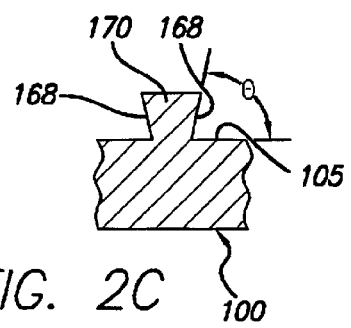
FIG. 2C is a cross-sectional view of a portion of an exemplary forming tool, taken across the width of an exemplary protruding embossing surface, according to an embodiment of the invention having re-entrant embossing teeth.

A cross-sectional view across the width of an embossing tooth 112, taken in the direction indicated by arrows 2B in FIG. 1B, is shown in FIG. 2B. Tooth 112 has sidewalls 168, each of which is disposed at an angle θ to surface 105 of tool 100. Angle θ is preferably slightly acute, exactly perpendicular, or slightly obtuse. In FIG. 2B, a tooth 112 with beveled sidewalls 168 having an angle θ slightly greater than 90°, i.e., a slightly obtuse angle, is shown. A slightly obtuse angle facilitates entry and withdrawal of tool 100 from moldable material, and is preferred for relatively stiff or tacky mold materials. A similar view of a re-entrant embossing tooth 170 having an angle slightly less than 90°, i.e., a slightly acute angle, is shown in FIG. 2C. A re-entrant tooth, such as tooth 170, is particularly preferred for use with elastomeric mold materials where a recessed microelectronic spring mold having an overhanging lip is desired. When present, an overhanging lip is typically positioned similarly to lip 142, shown in FIG. 1B. The utility of an overhanging lip is discussed in the co-pending parent applications.

Figure 2D:
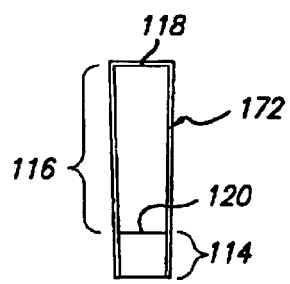
FIGS. 2D–2I are plan views of exemplary embossing teeth of forming tools according to the invention.
Figure 2E:
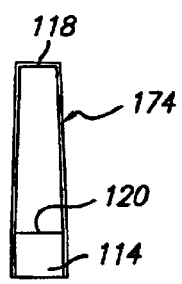
Figure 2F:
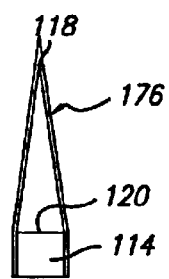

Embossing teeth may be shaped differently to form spring structures having various shapes in plan view, as exemplified by the shapes shown in FIGS. 2D–2I. In each of the foregoing figures, the relative positions of a protruding area 114, a sloped portion 116, and other previously described geometric elements, are indicated. FIG. 2D shows a plan view of a rectangular tooth 172, for forming a spring structure with a beam and base that are both rectangular in plan view; FIG. 2E shows a trapezoidal tooth 174, for forming a trapezoidal beam and a rectangular base; and FIG. 2F shows a triangular tooth 176, for forming a triangular beam and rectangular base.

Figure 2G:
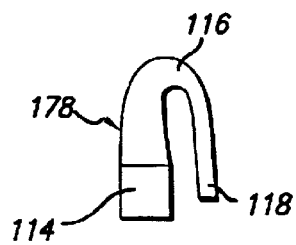
Figure 2H:
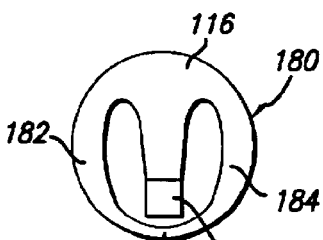
Figure 3A:
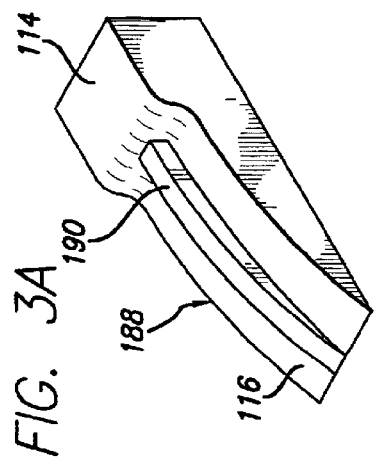
FIGS. 3A–3F are perspective views of exemplary protruding embossing teeth of forming tools according to the invention.
Figure 3B:
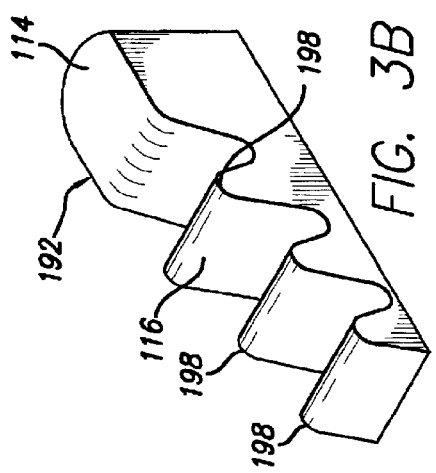
Figure 3C:
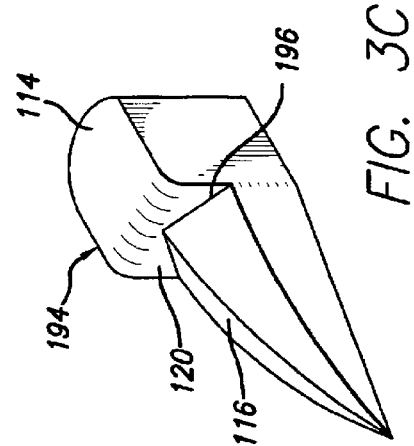
Figure 3D:
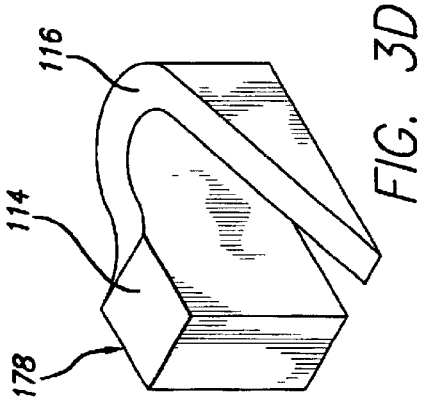
Figure 3E:
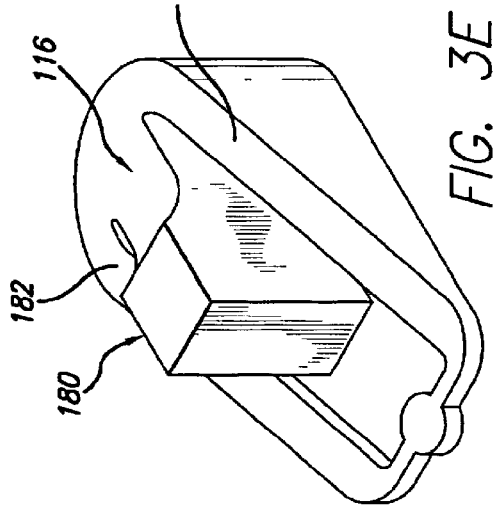

More exotic shapes may be desirable for some applications. For example, useful shapes may be selected from a trapezoid, a U-shape, a C-shape, a J-shape, a spiral, a square wave, or a sinusoid. FIG. 2G shows a U-shaped tooth 178, for forming a U-shaped beam with a tip that positioned near the base of the spring; and FIG. 2H shows an exemplary tooth 180 for forming a bifurcated beam with parallel arms. A perspective view of tooth 178 is shown in FIG. 3D, and a perspective view of tooth 180 is shown in FIG. 3E. Tooth 180 has two parallel arms 182 and 184 comprising a portion of sloped portion 116. The arms 182 and 184 preferably meet and are joined to one another at their respective distal ends 118. Tooth 178 and tooth 180 are similar in that both types of teeth are for forming a mold for a spring structure having a beam with its distal tip positioned closer to the spring base than intermediate portions of the beam; that is, a beam which loops back towards the base. Such a configuration is useful for reducing the footprint (plan area) required for a given structure, and for reducing the moment arm on the spring base caused by a force applied to the spring tip.

Figure 2I:
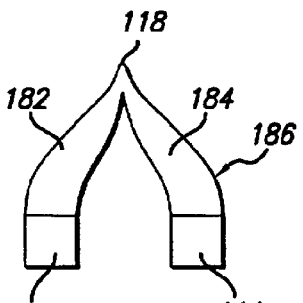
Figure 3F:
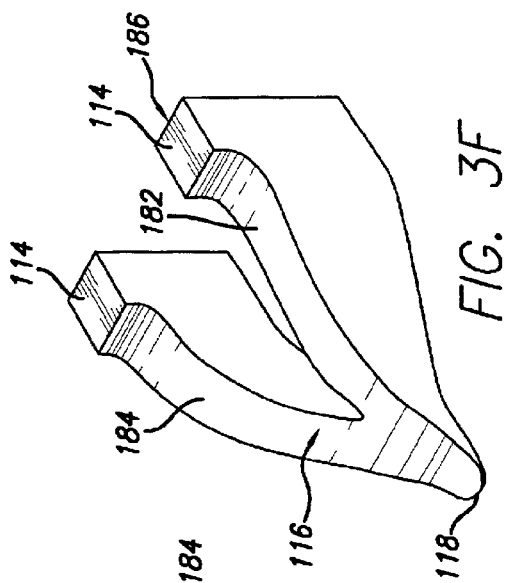

FIG. 2I shows a plan view of a wishbone-shaped embossing tooth 186. The sloped portion 116 of tooth 186 has two arms 182, 184 which converge from two protruding areas 114 and are joined at a distal end 118. A perspective view of tooth 186 is shown in FIG. 3F. Teeth with multiple arms, such as wishbone-shaped tooth 186, are for forming molds for spring structures to connect a single terminal on a first component or semiconductor device to multiple terminals on a second component or semiconductor device. It should be apparent that more than two arms may be provided in an embossing tooth. Furthermore, multiple arms may be configured to diverge from a single protruding area to multiple, separate distal ends.

Embossing teeth that are contoured in the z-direction, that is, in a direction perpendicular to embossing face 104, are an important aspect of the invention. Examples of z-contouring are provided by the contour of sloped portion 116, such as is visible in FIG. 2A. Useful contours include curves selected from an S-curve, a convex curve, a concave curve, and a sinusoid. Further exemplary tooth shapes exhibiting contouring in the z-direction include a ribbed tooth 188, shown in FIG. 3A, for forming a ribbed beam of a spring structure. Ribbed tooth 188 has a rib 190 running in a length direction of sloped portion 116. A plurality of parallel ribs (not shown), each of which is similar to rib 190, may be provided on sloped portion 116, if desired. Another exemplary tooth 192, having a corrugated sloped portion 116 for forming a mold for a corrugated beam is shown in FIG. 3B. Corrugations 198 are provided in a length direction of sloped portion 116. Yet another exemplary tooth 194, with a V-shaped sloped portion 116 for forming a V-shaped beam, is shown in FIG. 3C. The V shaped profile 196 of slope 116 is visible on a surface of step 120. It will be apparent that the desired shape of any given embossing tooth will be defined by the molding counterpart of the desired spring structure shape. Further advantages and characteristics of various contoured spring structures are described in the co-pending application Ser. No. 09/710,539, referenced above. Once the desired spring structure shape is known, one skilled in the art may design a suitable embossing tooth for forming a mold for the desired structure, by adaptation of the design principles and methods disclosed herein, and in the co-pending parent applications referenced above.

Methods for Making Forming Tools

Various exemplary methods for making a forming tool are disclosed herein, and it should be apparent that the choice of a preferred method will depend on factors such as the type of manufacturing equipment available, the characteristics of the molding materials, cost and time constraints, the desired properties of the springs, and so forth, that will vary depending on the circumstances. In some circumstances, two or more methods may be equally preferable. Additionally, some of the selected steps of the exemplary methods may be combined in various ways, and optional steps may be omitted, depending on these and similar variable factors.

Generally, the methods disclosed herein for forming forming tools are subject to a lower limit on feature size of about 0.1 micron. While there is no clearly defined upper limit on feature size, above a certain feature size, for example, features that require forming the sacrificial layer 30 to depths of greater than about 10,000 microns (about 1 cm or 400 mils, corresponding to an embossing tooth height of about 400 mils), prior art fabrication methods for sheet metal springs, such as sheet metal stamping, are likely to be more economically feasible. However, prior art methods are limited in their capability for cost-effectively making stampings tools for very closely spaced springs, i.e., springs disposed at a pitch of less than about 50 mils, which is preferable for many semiconductor applications. The methods disclosed herein are particularly preferred for making forming tools smaller than those that can be effectively manufactured using prior art methods, and more particularly towards the lower limits on feature size (i.e., a pitch of between about 5 to 50 mils and an embossing tooth height of less than about 100 mils). If desired, the forming tools can be made at essentially the same scale and pitch as typical contact pads of semiconductor devices. To reliably and cost-effectively fabricate contoured embossing surfaces of forming tools at this small scale, novel manufacturing methods are required, as disclosed herein.

Material Removal (Sculpting) Method

Various computer controlled, precision cutting and machining tools are currently available that may be used to define the embossing surface of a forming tool according to the invention by removal of material from a substrate. For example, the embossing surface 110 of forming tool 100 may be formed from a relatively hard material using a computer-controlled, ultraviolet ("UV") laser-ablation process, using an excimer laser, or a pulsed NdYag laser such as are available from Lambda Physik, Inc., located in Fort Lauderdale, Fla., or from Heidelberg Instruments Mikrotechnik GmbH, located in Heidelberg, Germany. In the alternative, a laser microchemical process, also called laser-assisted etching, available from Revise, Inc. located in Burlington, Mass., may be used to form the forming tool. Yet another alternative is to use a gray-scale photolithography mask, such as available from Canyon Materials, Inc., of San Diego, Calif., to form a pattern with a surface profile in a photopatternable glass or a layer of photoresist (which may be used as a mold for the forming tool). For further example, an EDM (electro-discharge machining) method may be used to form features on a forming tool. All of the foregoing methods for forming a forming tool are capable of defining features with submicron resolution, and thus may be used for forming spring structures with molded features to about 0.1 micron in size. For example, a spring structure with a cantilevered beam portion as narrow as about 0.1 microns may be made using one of the sculpting methods described above.

However, each of the foregoing sculpting techniques tends to be relatively slow and/or to require expensive manufacturing equipment. An alternative material method uses a rotating cutting tool, such as a precision diamond saw or grinding wheel. Views of a tool material substrate during steps of a material-removal method 500 using a cutting tool are shown in FIGS. 4A–4D, and a flow diagram of exemplary steps is shown in FIG. 5. At an initial step 502, a substrate of tool material 101 is provided and mounted in a suitable machining fixture (not shown) as known in the art. Tool material 101 preferably has a substantially planar surface 202; if necessary, surface 202 may be planarized using a process such as chemical-mechanical polishing. At step 504, a precision rotary cutting tool is provided.

Preferably, the cutting tool comprises a precision grinding wheel 206, provided with a radially contoured surface 208, shown in FIG. 4B. Contoured surface 208 preferably comprises a first portion 210, contoured to define a sloped portion 158 of an elongated embossing tooth 154, and a second portion 212, for defining a surface 105 for spacing apart adjacent embossing teeth. Alternatively, the cutting tool comprises a thin rotary milling tool, such as a diamond saw 204, having a thickness "t" preferably less than about 20 mils, and more preferably, less than about 5 mils. It should be appreciated that, in general, it is preferable to use a single type of cutting tool to define an embossing surface on any given tool, and FIGS. 4B–4D show different cutting tools and the resulting embossing teeth on the same substrate for illustrative purposes only.

At step 506, a series of parallel cuts are made in surface 202 of tool material 101, by repeated lowering the selected cutting tool (e.g., saw 204 or grinding wheel 206) into the material 101, advancing the tool in a defined direction, raising the tool, and repositioning the tool for another cut. A cross sectional view of exemplary cuts is shown in FIG. 4B. At least one elongated embossing tooth 154 is defined by the action of the grinding wheel 206. Each tooth 154 has an elongated sloping portion 154 and an elongated protruding area, which is preferably co-planar with surface 202. An elongated step 160 is optionally provided, preferably by lowering wheel 206 so that step 160 is cut by front face 207. An elongated embossing tooth 155 may also be defined by repeated application of saw 204. The sloping portion 159 of tooth 155 is stepped, unlike smoothly contoured sloping portion 158 of tooth 154. A stepped sloping portion is generally less preferred, but may be acceptable for some applications. A forming tool 152 with elongated teeth is formed after completion of step 506, as shown in plan view in FIG. 4C. Tool 152 comprises a completed forming tool having elongated embossing teeth, as previously described. Alternatively, additional steps 508 and 510 may be performed on tool 152 to define a forming tool 100, having separate embossing teeth, such as tooth 106, spaced apart by pitch "p."

At step 508, an appropriate cutting tool is selected and the direction of the tool path is rotated to intersect, such as at right angles, the tool path which defined the elongated teeth in step 506, thereby defining rectangular embossing teeth. Intersection angles different that 90° may be used, for example, to define triangular or trapezoidal embossing teeth. For steps 508 and 510, a preferable cutting tool comprises a saw having a thickness "t" approximately equal to the desired width of streets 216 separating the embossing teeth on tool 100, shown in plan view in FIG. 4D. If a thin rotary milling tool, such as diamond saw 204, is used in step 506, the same tool may be used in step 510. Alternatively, a cutting tool having a different thickness may be selected. The cutting tool selected for step 510 may additionally include a beveled cutting edge Inot shown) for providing beveled sidewalls, as described above in connection with FIGS. 2B and 2C. In step 510, parallel cuts are made, similarly to those made in step 506. After completion of step 510, tool 100 is generally ready for use as a forming tool, although it may be further processed, for example, in a deburring operation or coated with a release material, if desired.

General Molding Method

Although method 500 is suitable for making forming tools according to the invention, the costs of individual forming tools may be reduced by using a sculpted or machined forming tool 222 as a plug mold for making numerous identical forming tools. Exemplary steps of a method 700 for molding forming tools are shown in FIG. 7, and cross-sectional views of molded substrates and forming tools are shown in FIGS. 6A–6J.

At initial step 702, a substrate 218 comprised of a formable material is provided, preferably layered on a relatively hard support substrate 220. Formable substrate 218 may comprise one of many materials capable of being formed into a mold for a forming tool. Preferably, substrate 218 comprises a moldable or impressionable material, such as PMMA (poly methyl methacrylate, or acrylic), which can be coated on support substrate 220 to the desired thickness, which will deform when pressed with a mold or stamp, which will receive the tool material to be deposited thereon, and which can then readily be removed without damaging the tool material. Additional candidate materials for substrate 218 include polycarbonate, polyurethane, ABS plastic, various photo-resist resins such as phenol-formaldehyde novolac resins, epoxies and waxes. The substrate 218 preferably has a uniform thickness, and is thick enough to define a mold for a forming tool when contoured, for example, by impressing a forming tool 222. Various methods known in the art, for example, spin coating and lamination, may be used to deposit substrate 218 onto support substrate 220. A cross-sectional view of a substrate 218 and corresponding forming tool 222 are shown in FIG. 6A.

At step 704, a plurality of shaped impressions 227 is formed in a surface 224 of substrate 218, preferably by impressing a forming tool 222 into surface 224. Alternatively, substrate 218 comprises a liquid molding material that is injected into a mold cavity defined between the embossing face 104 of forming tool 222 and support substrate 220. The liquid molding material is then cured or hardened, as known in the art. The embossing face 104 of forming tool 222 is shaped essentially the same as an embossing face 104 of forming tool 100 previously described, because forming tool 222 serves as a plug mold for a forming tool 100. Hence, embossing face 104 of forming tool 222 is provided with embossing teeth 106, as previously described. A partial cross-sectional view of forming tool 222 impressed against (or immersed in) substrate 218 is shown in FIG. 6B.

In a preferred embodiment, when teeth 106 have been impressed or immersed into substrate 218 to the desired depth, flash fills the recessed regions between teeth 106 of forming tool 222 to define a molding surface 226. Forming tool 222 may be heated to assist deformation of substrate 218, and then cooled to harden substrate 218 into place. In an alternative embodiment, substrate 218 is selected of a material that is sufficiently deformable to flow under pressure without application of heat, and sufficiently viscous to hold its shape after tool 222 is removed. In yet another alternative embodiment, heat, UV light, or chemical catalysts are used to harden substrate 218 while under forming tool 222, and then tool 222 is removed. In yet another embodiment, ultrasonic energy is applied by tool 222 to soften substrate 218 for molding. After forming the shaped impressions 227 and after substrate 218 is sufficiently hardened, forming tool 222 is removed to reveal molding surfaces 226 in molding substrate 218, shown in FIGS. 6C and 6G.

At step 706, molding surface 226 is prepared to receive the tool material selected for the forming tool to be made. In an embodiment of the invention, a metallic tool material is deposited, such as by electroplating, over molding surface 226. FIGS. 6C–6F show the configuration of materials used during steps of this first embodiment. In a second embodiment, a non-metallic material, such as a plastic material, is deposited over molding surface 226. FIGS. 6G–6J show the configuration of materials used during steps of the second embodiment. In the first embodiment, to prepare molding surface 226 for deposition of a metallic material, a seed layer 228 is preferably deposited, using a method such as sputtering, CVD, or PVD, as shown in FIG. 6C. Seed layer 226 facilitates a subsequent electroplating step. In the second embodiment, to prepare molding surface 226 for a non-metallic material, molding surface 226 is preferably coated with a suitable mold release agent 229, as known in the art and as shown in FIG. 6G.

At step 708, a tool material is deposited over the prepared molding surface 226. In the first embodiment, metallic materials are preferably deposited by electroplating, as shown in FIG. 6D. Electroplating is relatively inexpensive, and provides a shorter deposition time than alternative deposition techniques, such as sputtering, while providing void-free, precise conformity of metal layer 230 to molding surface 226. Preferably, the metallic layer is deposited to a thickness of at least about 5 mils, and more preferably, at least about 20 mils thick. Suitable metals for electroplating include nickel, cobalt, chrome, molybdenum and their alloys, including Ni—Co and Ni—Co—Cr. An upper surface 238 of metallic layer 230 is preferably planarized after it is deposited, to provide a mounting surface for later attachment to a support substrate. In the second embodiment, non-metallic materials, such as plastics, are preferably deposited by coating or flowing a liquid plastic material on molding surface 226, and then hardening the plastic material, for example, by heat, chemical, or UV cure, by cooling, or by heat curing. FIG. 6H shows a layer of plastic material 232 deposited on molding surface 226. A layer of reinforcement material 234 is preferably secured to a surface 236 of plastic material layer 232. Reinforcement material 234 may be deposited on the plastic material layer after the plastic is solidified, for example, by electroplating, or by adhering a sheet of reinforcement material to surface 236. More preferably, plastic layer 232 is bonded to reinforcement material 234 while the plastic is in a liquid state, by injecting the liquid plastic between the molding surface 226 and reinforcement material 234. In this embodiment, the reinforcement material essentially serves as part of a wall of an injection mold cavity.

At step 708, the hardened or solidified tool material is removed from the molding substrate. In either embodiment, as shown in FIG. 6E, substrate 218 may be removed by a destructive process, such as chemical etching, dissolution in solvents, or fluid abrasion. Alternatively in either embodiment, substrate 218 is removed by a nondestructive process, as shown in FIG. 6I, thereby preserving it for re-use, if desired. FIG. 6F shows a cross-sectional partial view of an exemplary metallic forming tool 240 made by general molding method 700. FIG. 6J shows a cross-sectional partial view of an exemplary non-metallic forming tool made by general molding method 700. It should be appreciated that the steps of general method 700 may be modified, and additional steps may be added, without departing from the invention disclosed herein. It should further be appreciated that the general molding method 700 requires a forming tool 222 with an embossing surface shaped like the embossing surface of the desired forming tool. Hence, method 700 is essentially a method for replicating a forming tool, which may be formed by any of the methods described herein.

Repetitive-Stamping Method

Exemplary steps of a method 900 of making a forming tool by repeated application of a forming tool to a formable substrate are shown in FIG. 9. Views of the forming tool and related materials during steps of method 900 are shown in FIGS. 8A–8E. The repetitive-stamping method 900 has the primary advantage of providing for replication of as few as a single embossing tooth at multiple locations on a forming tool, thereby eliminating the need to make a forming tool 222 having a plurality of embossing teeth. Instead, a forming tool 244 for a single tooth, or a relatively small number or teeth, may be made using one of the methods disclosed herein, and the forming tool 244 then used to replicate embossing teeth at multiple locations on a forming tool.

Referring to FIG. 9, at initial step 902, a formable substrate 248 is provided, preferably on a support substrate 220. The materials used in substrate 248 are preferably formable, like the materials for substrate 218 used in method 700. Additionally, the materials used in substrate 248 are preferably curable by exposure to ultraviolet (UV) light, or similar radiation, such as a photopolymer material. At step 904, a forming tool 244 is provided. A partial cross-sectional view of an exemplary forming tool 244 is shown in FIG. 8A. Forming tool 244 comprises at least one forming tooth 246 provided with a forming surface 250. Forming surface 250 is preferably contoured in the shape of a desired embossing tooth to be formed on the forming tool. In an embodiment of the invention, forming tooth 246 is the molding counterpart of the desired embossing tooth. Forming tooth 246 may be made using one of the material removal methods disclosed herein. Forming tooth 246 is preferably comprised of a UV-transparent material, such as a photopatternable glass, and has UV-opaque sidewalls 252, to prevent exposing adjacent areas of formable material to UV light. For example, a thin layer of aluminum may be deposited on sidewalls 252 while the forming surface 250 is protected by a mask.

At step 906, forming tool 244 is impressed into the formable substrate 248. FIG. 8B shows the position of a forming tooth 246 when forming tool 244 is impressed a maximum amount into substrate 248. Preferably, tooth 246 is impressed until it just contacts the support substrate 220. In this position, excess forming material of substrate 248, called "flash" 254, is pushed up adjacent to forming tooth 246. At step 908, while the forming tooth 246 is held in position, the material under the forming surface 250 is cured, preferably by beaming UV light through forming tooth 246. Tool 244 is then removed from substrate 248, exposing a protrusion of cured material 258, surrounded by an uncured region of flash 254, as shown in FIG. 8C. The extent to which the flash 254 slumps over and covers protrusion 258 will vary, depending on the characteristics of substrate 248. In an embodiment of the invention, the resulting protrusion 258 is shaped like, and capable of performing the function of, an embossing tooth of a forming tool, such as the previously described tooth 112 of tool 100.

At step 912, if more protrusions, i.e., embossing teeth 258 are desired, steps 906–910 are repeated until the desired number of cured embossing teeth 258 have been formed. FIG. 8C shows a support substrate 220 having a plurality of cured protrusions 258 (two of many shown), each in the shape of an embossing tooth, surrounded by uncured portions of substrate comprising flash 254. At step 914, flash 254 is removed, revealing the embossing teeth 258 on support substrate 220. In an embodiment of the invention, the substrate 220 with embossing teeth 258 may be used as a forming tool, such as tool 100, having an embossing face 104 as shown in FIG. 8E.

It should be appreciated that, if forming tooth 246 is not the molding counterpart of the desired embossing tooth, and is instead in the shape of the embossing tooth itself, each cured material protrusion 258 will not be in the shape of an embossing tooth but will instead be in the shape of a molding counterpart of an embossing tooth. In such case, the support substrate 220 with cured protrusions 258 will not be suitable for use as a forming tool. It may, however, be adapted to serve as a molding surface 226 for a forming tool, as shown, e.g., in FIG. 6C discussed above.

Other methods which use photo-curable polymers may also be used to form a forming tool as described above. For example, stereo lithography using a laser to selectively cure portions of a liquid polymer, such as used for rapid prototyping applications, may be used to form a forming tool, or a mold for a forming tool.

Method for Making a Forming Tool with Transparent Teeth

A forming tool having a plurality of transparent teeth surrounded by opaque regions is useful for use with a UV-curable (or other radiation-curable) molding material. Such a tool can be used in a fashion similar to the repetitively-applied forming tooth 246 discussed above. Advantageously, a tool with transparent teeth surrounded by opaque regions may be used to define molds for a plurality of microelectronic spring structures in a single stamping/curing step. The present invention provides a method for making such a tool.

One method for making a forming tool with opaque and transparent regions requires forming a tool out of a relatively hard and strong transparent material, such as fused silica or quartz. Regions of the tool which are to be made opaque are then covered with a thin patterned layer of opaque material, such as a layer of gold or aluminum deposited by evaporation, vapor deposition, or sputtering through a pattern mask. For this method, a tool blank of the transparent material may be formed into a forming tool using a material removal method such as previously described. For example, a photo-patternable glass, such as Schott Foturan™, can be contoured to define an embossing surface using gray-scale lithography. Alternatively, a fused silica blank can be contoured using deep reactive ion etching ("RIE") equipment such as is available from Surface Technology Systems Ltd., of Imperial Park, Newport, United Kingdom in conjunction with a contoured photoresist mask, as follows. A surface of the tool blank is first coated with a layer of photoresist. The layer of photoresist is then contoured using gray-scale lithography. The RIE etch is performed on the layer of photo-resist, which amplifies the contoured surface of the photoresist in the underlying tool blank. However, a drawback of the methods that require forming a tool out of relatively hard materials is relatively high manufacturing cost.

Figure 10A:
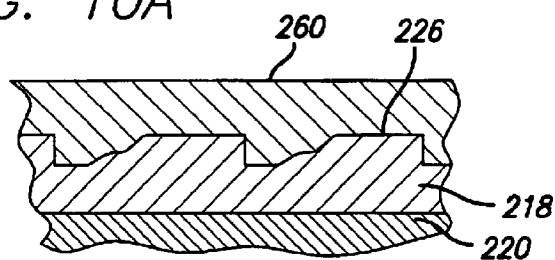
FIGS. 10A–10D are cross-sectional views of a molding substrate and related materials during exemplary steps of a plug-and-mold method for making a microelectronic spring mold forming tool having transparent embossing teeth.
Figure 10B:
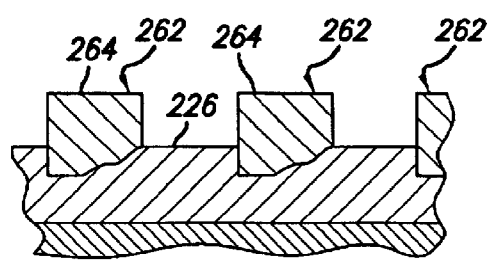
Figure 10C:
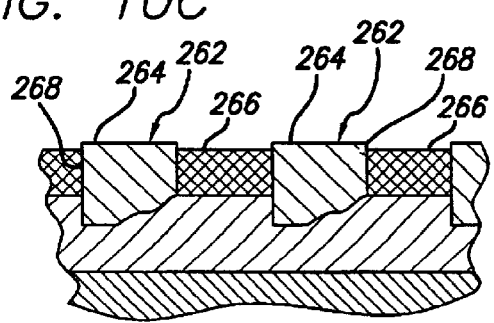
Figure 10D:
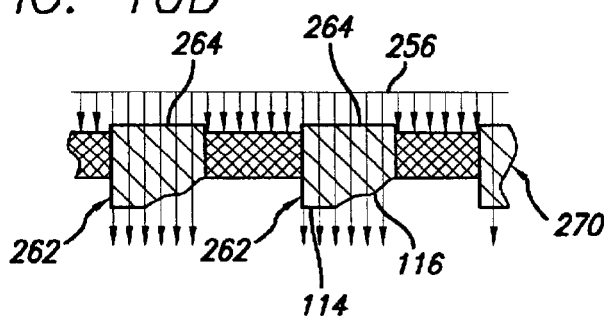
Figure 11:
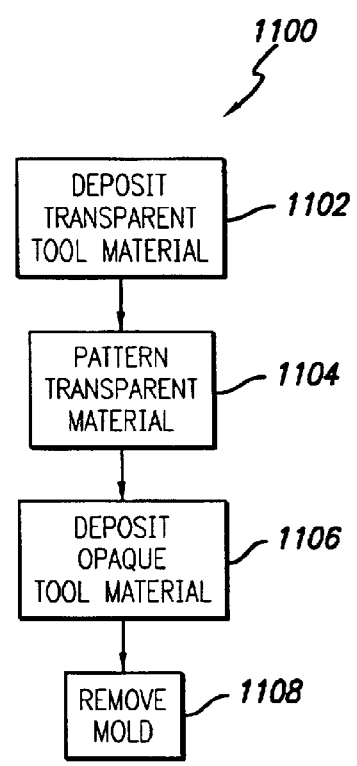
FIG. 11 is a flow diagram showing exemplary steps of a plug-and-mold method for making a microelectronic spring mold forming tool having transparent embossing teeth.

Lower manufacturing costs may be realized by using the method 1100, exemplary steps of which are shown in FIG. 11. Views of tool materials and a supporting molding fixture during steps of method 1100 are shown in FIGS. 10A–10D. At step 1102, a relatively thick layer of patternable, UV transparent material 260 is deposited on a formable substrate 218 having a molding surface 226. Substrate 218 and molding surface 226 are provided in accordance with general molding method 700, described above. UV transparent material 260 is preferably an SU-8 photoresist (epoxy-type, based on EPON™ SU-8 epoxy resin from Shell Chemicals™), such as available from MicroChem Corp. of Newton, Mass. SU-8 may be patterned lithographically in layers up to about 2 mm thick, as known in the art. In addition, SU-8 is suitable for use with the present method because it is relatively transparent to UV light after being cured. A cross-sectional view of the layer of transparent material 260 deposited on molding surface 226 is shown in FIG. 1A.

At step 1102, the transparent material is patterned and cured as known in the art. FIG. 10B shows a view of the resulting transparent embossing teeth 262 on molding surface 226, after uncured portions of material layer 260 have been removed. The exposed portions of molding surface 226 may be prepared for a subsequent depositing step (such as an electroplating step) by deposition of a suitable seed layer thereon. However, care should be taken to avoid covering the top surface 264 of tooth 262 with any opaque materials.

At step 1106, an opaque material 266 is deposited on the molding surface, between and adhering to sidewalls 268 of embossing teeth 262. In an embodiment of the invention, a metal, such as nickel, is deposited by electroplating onto a patterned seed layer, as shown in FIG. 10C. A metallic material such as nickel has the advantage of providing strength and structural integrity to the forming tool, as well as being totally opaque to UV light. Opaque material 266 preferably covers substantially all of the sidewalls 268 of embossing teeth 262 protruding from layer 218. At step 1108, the mold, comprising formable material layer 218 and substrate 220, is removed from the deposited materials, freeing the transparent/opaque forming tool 270, as shown in FIG. 10D. UV light 256 may be beamed at the top surface of tool 270, where it will be transmitted only through top surfaces 264 of teeth 262 and emitted at sloped portions 116 and protruding areas 114. It should be apparent that a thin layer of opaque material may be deposited to cover protruding area 114, if desired, thereby preventing transmission of UV light into base portions of a mold for microelectronic springs. As shown in FIG. 10D, a further advantage of method 1100 is that substantially all of the sidewalls 268 may be covered by an opaque material, thereby reducing UV light leakage.

Liquid-Meniscus Method

Figure 12A:
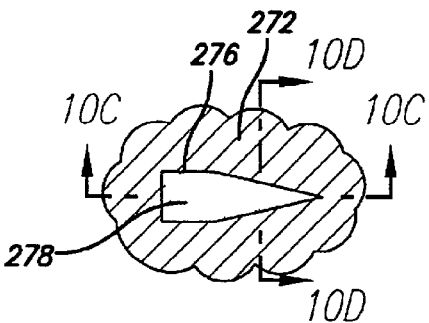
FIG. 12A is a plan view of a sacrificial material layer and depression formed therein during an exemplary step of a liquid-meniscus method for making a microelectronic spring mold forming tool.
Figure 13:
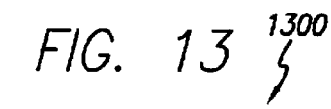
FIG. 13 is a flow diagram showing exemplary steps of a liquid-meniscus method for making a microelectronic spring mold forming tool.
Figure 12B:
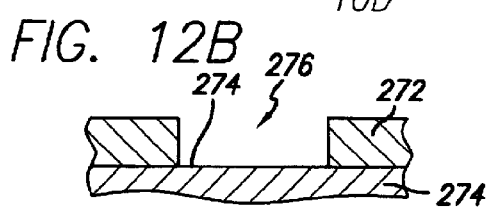
FIGS. 12B–12H are cross-sectional views of a sacrificial layer, liquid meniscus, and related materials during exemplary steps of a liquid-meniscus method for making a microelectronic spring mold forming tool.

For some applications, it may be advantageous to form a forming tool with contoured embossing teeth by exploiting the contoured surface provided by a liquid meniscus. Method 1300, exemplary steps of which are shown in FIG. 13, is such a method. Related views of a substrate with layered materials during steps of the method 1300 are shown in FIGS. 12A–12H. In an initial step 1302, a layer of sacrificial material 272 is deposited on a supporting substrate 274. Sacrificial layer 272 is preferably deposited in a layer of uniform thickness, using any of the methods previously described. In step 1304, the layer of sacrificial material is patterned to form one or more depressions 276, as shown in FIG. 12B, preferably extending to the surface of substrate 274 in at least a portion of the depression 276. Various methods known in the art, such as photo patterning, may be used to form depression 276. In plan view, such as shown in FIG. 12A, depression 276 has the shape of the embossing tooth to be formed, which may be any of the shapes previously described, or any other suitable shape. For example, in an embodiment of the invention, the tooth shape is triangular in plan view, and the base area is rectangular, as shown in FIG. 12A.

In step 1306, the surfaces of depression 276, and in particular, the sidewalls, are preferably treated to alter their wetting properties as desired. The wetting properties can be modified by various techniques as known in the art, such as silanization. For further example, exposure to plasmas of oxygen, nitrogen/hydrogen, and other gases can change surface wetting properties. Further, increasing the surface roughness will generally increase the wetability of the surface. The sidewalls of the depression 276 are treated to alter the surface energy, which determines wetability, relative to the chosen wetting fluid. If a concave meniscus is desired, the surface energy of the sidewalls is decreased (if necessary) such that the chosen wetting fluid will cling to the sidewalls and form a concave men iscus in the depression 276. Conversely, if a convex meniscus is desired, the sidewalls are treated to repel the wetting fluid, thereby causing the liquid to form a bead having a convex meniscus. In the preferred embodiment of the invention, the selection of the sacrificial material, wetting fluid, and recess shape are such that no surface treatment of the depression 276 is needed to achieve the desired meniscus shape. In general, it is preferred that the surface of depressions 276 be easily wetted, to avoid difficulties with filling multiple recesses with a uniform quantity of fluid.

In step 1308, depression 276 is partially filled with a suitable wetting fluid 278. A suitable fluid is a liquid with a low enough viscosity and surface tension to wet depression 276, which may be solidified without significant shrinkage or otherwise distorting the desired meniscus shape. In an embodiment of the present invention, fluid 278 is a photo-patternable material such as photoresist (e.g., SU8-25 or SU8-2). Several methods may be used to get a specified volume of fluid 278 into the depression 276. Generally the depressions 276 are small, for example about 250 microns wide, 250 microns deep, and 1000 microns long. The volume of a "manhattan" (rectangular) cavity with these dimensions is 62.5 nanoliters, and special techniques must be used to accurately deposit a specified volume of liquid, which is preferably less than the recess volume. In one embodiment, a substrate having depressions 276 with a volume of less than about 100 nanoliters is spin coated with a fluid 278. The spin-coating process leaves a small amount of fluid 278 in each cavity, the volume of which depends on the fluid viscosity, surface wetting properties of the fluid 278 and depression 276, the shape of depression 276, and spin process parameters such as rotational velocity and acceleration, and radial distance from the axis of rotation. Fluid 278 may be applied by directing a fluid mist onto a rotating substrate, or by immersion. A portion of the fluid 278 is also removed by the spin coating process from depression 276, so that the fluid 278 only partially fills the depression 276, as shown in cross-section in FIGS. 12C and 12D.

Figure 12C:
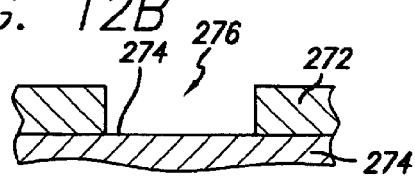
Figure 12D:
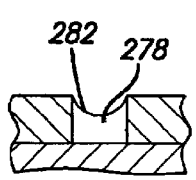

The relative surface energies of fluid 278 and the sidewalls of depression 276 are such that the fluid 278 has a meniscus having a first contoured shape 280 in the length direction of the depression 276, and a second contoured shape 282 in the width direction, as shown in FIGS. 12C and 12D, respectively. Where depression 276 is narrower, such as toward the point of the triangle shown in FIG. 12A, the surface tension of fluid 278 preferably causes surface 280 to rise, as shown in FIG. 12C. Across the width of depression 276, surface tension pulls the surface 282 into a concave U-shape.

Figure 12E:
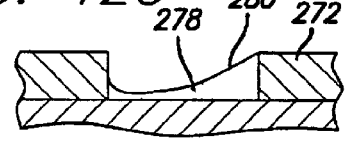
Figure 12F:
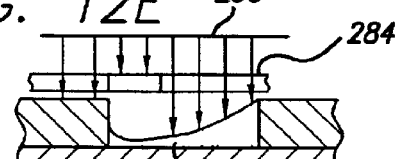
Figure 12G:
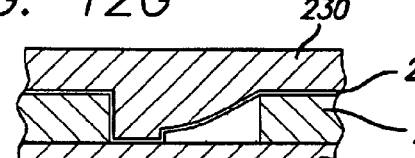
Figure 12H:
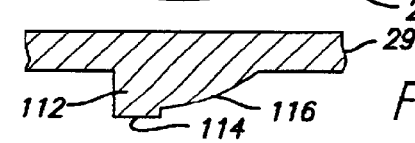

In step 1310, after the fluid 278 partially fills depression 276, the fluid is solidified, for example, by curing with a chemical catalyst or UV light, by heating to drive out solvents, or by cooling below its melting point. The solidified fluid 286 is then further patterned at step 1312 to define a mold for an embossing tooth. For example, as shown in FIG. 12E, a portion of the solidified fluid 286 may be removed in a base area 288, by exposing the solidified fluid 286 to an anisotropic etch 290 through mask 284. The remaining solidified fluid 286 with the exposed surfaces of the sacrificial layer 272 defines a contoured molding surface 292 including an exposed base area 288, as shown in FIG. 12F. At step 1314, a suitable tool material, such as metallic material 230, is deposited on molding surface 292 according to the previously described method 700, or other suitable method. For example, a seed layer 228 may be deposited on molding surface 292, and then a tool material comprising a metallic material may be electroplated on the seed layer 228. At step 1316, the sacrificial layer 272, solidified fluid 286, and supporting substrate 274 are removed from the tool material 230, thereby freeing a forming tool 294 having embossing teeth 112 (one of many shown), as shown in FIG. 12H. Each embossing tooth 112 has a protruding area 114 and a sloped portion 116, as previously described. Sloped portion 116 is contoured in the shape of a fluid meniscus.

Sheet Bending Method

In an alternative embodiment, the properties of a resilient sheet provided with a plurality of integral tangs are used to define a forming tool. Exemplary steps of a method 1500 using a resilient sheet with integral tangs are shown in FIG. 15, and related views of the sheet and other materials during steps of method 1500 are shown in FIGS. 14A–14F. An advantage of the sheet bending method is that the method is capable of achieving a contoured embossing surface without need for relatively expensive material removal methods.

In step 1502, a metal sheet 294 having integral tangs 296 is provided. Each tang 296 has a free end 299 and a fixed end 297. Sheet 294 is preferably a thin metal sheet, such as a stainless steel sheet about 1 to 2 mils thick. Each integral tang is preferably shaped, in plan view, to have the desired shape for an embossing tooth; FIG. 14A shows tangs 296 having a typical trapezoidal plan. Tangs 296 are preferably defined by material removal from sheet 294, such as by a lithographic etching process or by laser ablation.

In step 1504, a fixture 300 is provided, having a substantially planar upper surface 304 and a plurality of protrusions 302 disposed on surface 304. As shown in FIG. 14B, each protrusion 302 is relatively small compared to the length of tangs 296, and is preferably positioned to contact a portion of a tang 296 at free end 299. In the alternative, each protrusion is positioned to contact a tang 296 at a position intermediate between the fixed end 297 and free end 299. In either case, the height of each protrusion 302 above surface 304 is selected so that, when fixed end 297 is held against surface 304, protrusion 302 causes the free end 299 to deflect away from surface 304 a distance approximately equal to the desired height of the embossing tooth, i.e., the vertical distance "h" shown on FIG. 2A. Various methods may be used to provide protrusions 302 on surface 304, for example, by depositing and patterning a layer of lithographic material, or by etching surface 304 while protrusions 302 are suitably masked; by depositing precisely metered "dots" of materials, such as solder balls, at the desired locations on surface 304; by ball-bonding a wire cut to a desired length to substrate 304 at the desired locations; or by machining surface 304 using a process such as laser ablation or precision machining using a rotary cutting tool. Substrate 300 is optionally provided with a plurality of pores 306 for applying suction to sheet 294, to press it in place against surface 304 of fixture 300. Surface 304 is preferably coated with a thin layer of a release agent (not shown) to facilitate later removal of sheet 296. Alternatively, a thin layer of contact adhesive (not shown) is used to adhere sheet 296 to surface 304. If adhesive is used, it should be releasable (such as by application of heat or a selective solvent) so that sheet 296 does not become permanently adhered to fixture 300.

At step 1506, sheet 294 is aligned with fixture 300 so that each of its integral tangs 296 contacts a protrusion 302, while the remainder of sheet 294 does not contact any protrusions adjacent to any of tangs 296. While in this aligned position, sheet 294 is mounted to fixture 300, as shown in FIG. 14C. Suction (i.e., a pressure gradient) may be used to mount sheet 294 to fixture 300 using pores 306, by establishing a lower pressure on the underside of fixture 300 than on the opposite surface 304. When mounted to fixture 300, all of sheet 294 preferably contacts surface 304, except for at least a portion of each integral tang 296. Each tang 296 contacts surface 304 adjacent to its fixed end 297, and is deflected away from surface 304 by contacting a protrusion 302 so that its free end 299 is deflected a maximum distance away from surface 304 and tang 296 assumes a desired curvature.

At step 1508, while sheet 294 is mounted to fixture 300, a layer of fixative material 308 is deposited on an upper surface of sheet 294, as shown in FIG. 14D. It should be appreciated that fixative material 308 will typically flow underneath a lower surface 310 of each tang 296. However, flow underneath the tangs 296 is not required. Fixative material 308 is preferably a radiation curable (such as a UV-curable) resin that is compatible with the materials used for sheet 294, fixture 300, and protrusions 302, is readily deposited in a void-free, uniform layer over sheet 294, and has sufficient adhesion and mechanical integrity to hold tangs 296 in their deflected position and to serve as an embossing surface of a forming tool. For example, an SU-8 photoresist material as previously described is a candidate for fixative material 308, and one skilled in the art will be aware of alternative candidates for fixative material 308. After being deposited in a uniform layer, fixative material is cured, for example, by exposure to UV light 256. If resilient sheet 294 is comprised of a metal or other opaque material, each tang 296 serves as a mask preventing fixative material 308 underneath lower surfaces 310 from being exposed to UV light. Hence, the material 308 underneath tangs 296 may be protected from curing, and may be more easily removed in a subsequent step.

At step 1510, fixture 300 is removed from sheet 294 and fixative material 308. Preferably, protrusions 302 are removed along with fixture 300. At step 1512, any fixative material 308 remaining underneath lower surfaces 310 of tangs 296 is removed, preferably using a suitable solvent, such as acetone or IPA if material 308 is uncured underneath tangs 296, or using a dry etching process, such as by RIE, if the undesired portion of material 308 is cured or otherwise resistant to removal using a solvent. If a dry etching process is used, sheet 294 is preferably comprised of a material that will protect the portion of fixative material 308 above sheet 294 from over-etching. After removal of fixative material 308 from underneath tangs 296, forming tool 312 is thereby defined, as shown in FIG. 14E. Forming tool 312 has a plurality of embossing teeth, such as embossing tooth 112. Each embossing tooth is provided with features previously described, such as a protruding area 114 and sloping portion 116. If features such as step 120, shown in FIG. 14F, are desired, steps 120 may be provided at step 1502 by configuring sheet 294 to have a protruding area 314 adjacent to the fixed end 297 of each tang. It should be noted that forming tool 312 is typically of the recessed tooth type shown in FIG. 1E and previously described.

Stress-Gradient Method

In an alternative embodiment, the properties of a stress gradient induced in tangs deposited on a substrate are used to define a forming tool. Exemplary steps of a method 1700 using tangs deposited on a substrate are shown in FIG. 17, and related views of the tangs, substrate, and other materials during steps of method 1700 are shown in FIGS. 16A–16F. Method 1700 is similar to method 1500, in that both methods are capable of achieving contoured embossing surfaces without sculpturing or molding, and both make use of a bent tang or beam to define a contour for an embossing tooth.

Figure 16A:
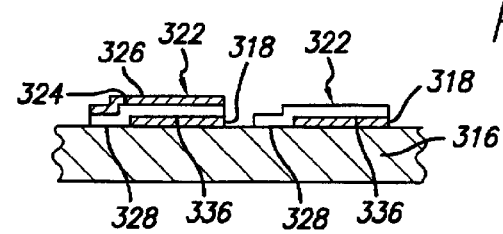
FIGS. 16A–16G are cross-sectional views of a substrate and materials layered thereon during exemplary steps of a stress-gradient method for making a microelectronic spring mold forming tool.
Figure 17:
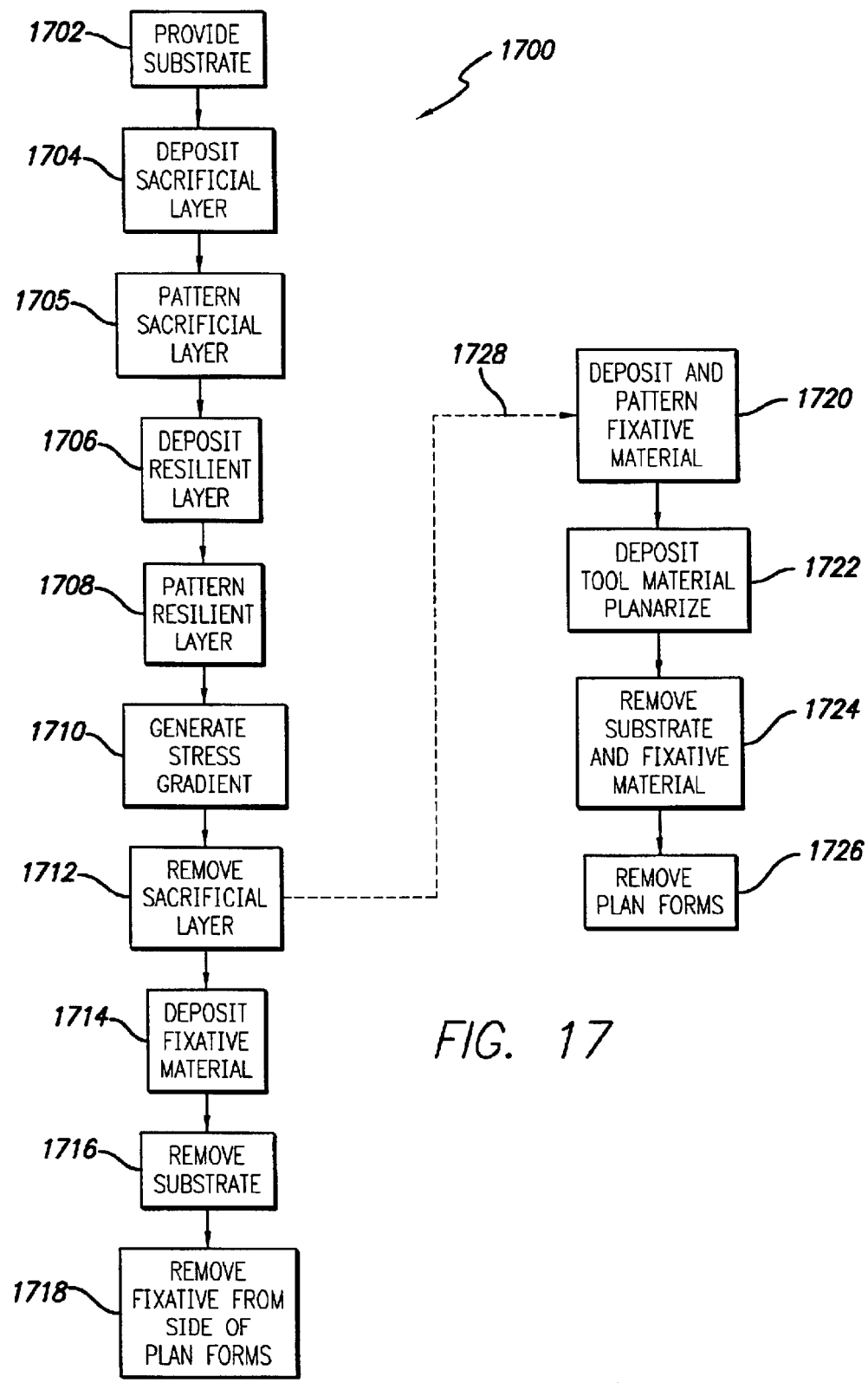
FIG. 17 is a flow diagram showing exemplary steps of a stress-gradient method for making a microelectronic spring mold forming tool.

At step 1702, a substrate 316 is provided as shown in FIG. 16A. Substrate 316 is preferably substantially planar, and may be selected from a wide variety of materials, so long as the materials are relatively stable and compatible with other materials being deposited thereon. For example, a silicon substrate is acceptable. At step 1704, a patterned sacrificial layer 318 is deposited on substrate 316 and patterned at step 1705 to reveal the substrate at selected exposed areas 328. Exposed areas 328 are preferably shaped, in plan view, in the shape of protruding areas (i.e., areas 114 previously described) of an embossing tooth for the forming tool to be formed. Sacrificial layer 318 comprises a readily removed material such as a photoresist material and/or a release agent. In an embodiment of the invention, sacrificial layer 318 is deposited in a layer having a thickness equal to a desired step height of embossing teeth (e.g., the height of step 120 shown on FIG. 1B) on the desired forming tool.

At step 1706, a patterned layer of resilient material is deposited on substrate 316 and sacrificial layer 318. The layer of resilient material is deposited in separate plan forms each of which has the projected shape, in plan view (e.g., trapezoidal, triangular, or rectangular), of an embossing tooth on the forming tool to be formed. Thus, each plan form comprises a beam area portion 321, corresponding to a sloped portion 116 of an embossing tooth, and a base area portion 323, corresponding to a protruding area 114 of an embossing tooth. FIG. 16A shows resilient layers of two types deposited on substrate 316: a first, monolayer type of resilient material layer 320, shown on the right side of FIG. 16A; and a second, bilayer layer 322, shown on the left side of FIG. 16A. Monolayer 320 comprises a monolayer type of plan form, and bilayer 322 comprises a bilayer type of plan form. It should be appreciated that, in practice, a single type of plan form (either monolayer or bilayer) is preferably used for making any particular forming tool, and the two different types of plan forms 320, 322 are shown together on the same substrate for illustrative purposes only. A first portion of each plan form 320, 322 contacts the substrate 316 at an exposed area 328, and a second portion of each plan form contacts the sacrificial layer 318, as shown in FIG. 16A.

Figure 16B:
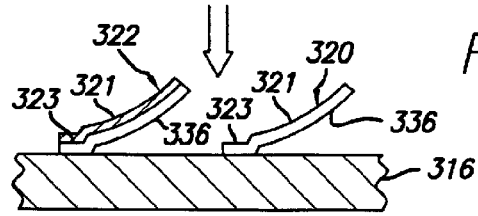

The resilient layer (comprising plan forms 320 or 322) is preferably deposited using a process such as CVD, sputtering, electroplating, or a combination of these methods. At step 1708, the resilient layer is patterned in the desired plan form shapes, such as by using a pattern mask as known in the art. Monolayer-type plans forms, such as plan form 320, preferably comprise a metallic material, such as nickel. At step 1710, a stress gradient, such as a compressive stress that is biased towards the underside 336 of plan form 320, is generated. For a monolayer type plan form, the stress gradient is preferably generated by controlling the conditions of deposition such that an increasingly residual tensile stress is generated as more material is deposited. Methods for controlling deposition to generate a residual stress are as known in the art. The resulting tensile stress, biased towards the upper surface of plan form 320, is equivalent to a compressive stress biased towards the underside 336. At step 1712, when sacrificial layer 318 is removed, such as by etching or dissolution in a solvent, the portion of plan form 320 which overlaid sacrificial layer 318 is freed, and the internal stress gradient in plan form 320 causes it to curl away from substrate 316 as shown in FIG. 16B.

In the alternative, a residual compressive stress is generated using a bilayer type plan form 322, conceptually similar to bimetallic strips used in old-fashioned, analog thermostats. A layer of first material 324 is deposited and patterned using conventional lithographic processes. A layer of second material 326 is deposited on top of the first material 324. Materials 324 and 326 are preferably metallic, and are selected such that material 324 has a greater coefficient of thermal expansion than material 326. Consequently, after sacrificial layer 318 is removed at step 1712, plan form 322 is heated to generate a compressive stress at step 1710. As with plan form 320, the compressive stress in plan form 322 causes it to curl away from substrate 316 as shown in FIG. 16B. An advantage of using bilayer plan forms such as plan form 322 is that the extent of curvature of the plan form can be controlled by controlling the temperature to which the plan form is heated. In comparison, the amount of residual compressive stress, and therefore the curvature, of monolayer plan form 320 is determined during deposition.

After step 1712, FIG. 7 shows alternative paths for completing fabrication of a forming tool. A first path comprises the subsequent steps 1714 to 1718. A second, alternative path, as indicated by dashed arrow 1728, comprises subsequent steps 1720 to 1726. These alternative paths are discussed in turn below.

Figure 16C:
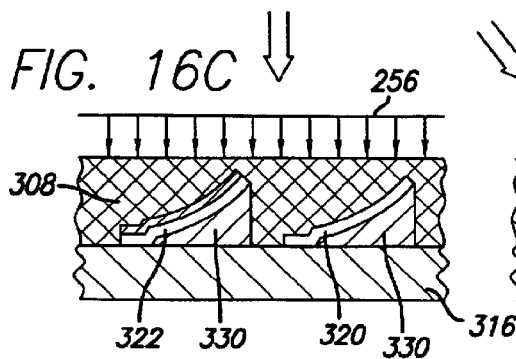
Figure 16E:
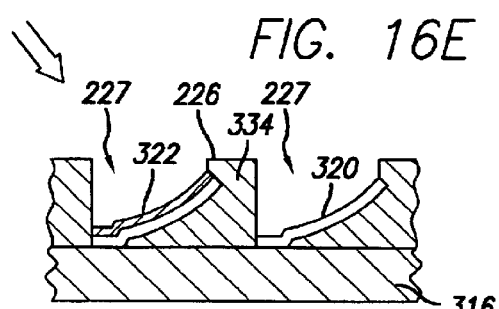
Figure 16D:
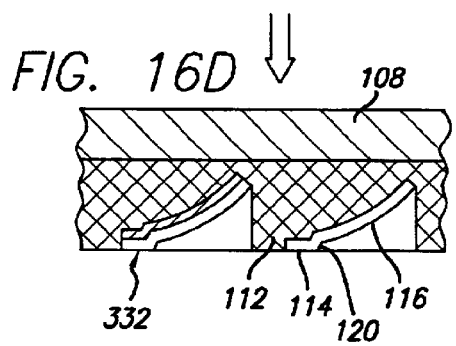

Steps 1714 to 1718 comprise a first path for completing a method of making a forming tool, which path is analogous to steps 1508 to 1512 of method 1500 described above. At step 1714, a fixative material 308 is deposited in a uniform layer to cover substrate 316 and plan forms 320, 322 as shown in FIG. 16C. Material 308 is cured, preferably using UV light 256 which leaves uncured portions 330 that are masked from the UV light 256 by plan forms 320, 322. Substrate 316 is removed at step 1716. At step 1718, uncured portions 330 of fixative material 308 are removed from underneath the plan forms 320, 322, leaving forming tool 332 as shown in FIG. 16D. Support substrate 108 is optionally attached to an upper surface of tool 332. Tool 332 is a recessed embossing tooth type, like forming tool 312 made using method 1500.

Steps 1720 to 1726 comprise a second, alternative path which produces a forming tool having protruding embossing teeth, like forming tool 100 shown in FIG. 1B. At step 1720, a fixative material 334 is deposited in a uniform layer covering plan forms 320, 322. Unlike material 308 used in step 1714, material 334 is preferably chemically or heat curable, so that material 334 underneath plan forms 320, 322 may be readily cured. Material 334 is patterned to remove material 334 above plan forms 320, 322, leaving shaped impressions 227 and molding surface 226 as shown in FIG. 16E. An anisotropic, dry etching process, such as RIE, is preferably used to remove material 334 from above plan forms 320, 322. Materials used for plan forms 320, 322 are likewise selected to be resistant to the etching process used for removal of material 334.

It should be apparent that shaped impressions 227 formed in step 1720 are analogous to shaped impressions 227 and molding surface 226 formed by step 704 of method 700.

Figure 16F:
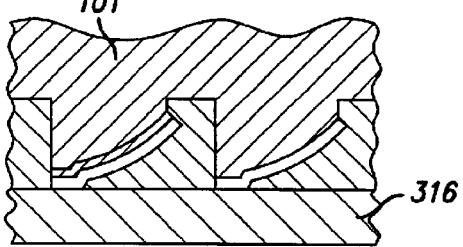
Figure 16G:
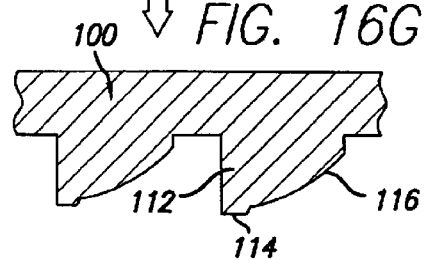

Thus, molding surface 226 may be used in the same manner as molding surface 226 is used in method 700 to make a metallic or other cast material forming tool. For example, in step 1722, a metallic tool material 101 may be deposited by electroplating, as shown in FIG. 16F. An upper surface of the deposited tool material 101 is preferably planarized. In step 1724, the substrate 316 and fixative material 334 are removed. Plan forms 320, 322 are optionally removed at step 1726, leaving forming tool 100 as shown in FIG. 16G, with protruding embossing teeth such as tooth 112, previously described.

Tang-Bending Method

Figure 18A:
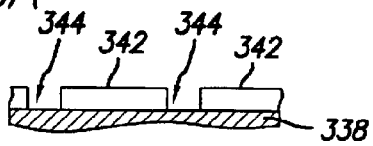
FIGS. 18A–18G are cross-sectional views of a substrate and materials layered thereon during exemplary steps of an independent-tang method for making a microelectronic spring mold forming tool.

In an alternative embodiment, cantilevered tangs are lithographically formed on a substrate, and their tips are deflected and fixed in a deflected position to define a forming tool. Exemplary steps of a method 1900 using cantilevered tangs are shown in FIG. 19, and related views of the tangs, substrate, and other materials during steps of method 1900 are shown in FIGS. 18A–18G. Method 1900 is similar to methods 1500 and 1700, in that each of these methods is capable of achieving contoured embossing surfaces without requiring use of a material removal method.

In step 1902, a substrate 338 is provided, which is preferably substantially planar. Unlike substrate 316 used in method 1700, substrate 338 will be retained as part of the finished forming tool. At step 1904, stand-offs 340 are deposited and patterned on substrate 338 using conventional lithographic techniques. FIG. 18A shows a portion of substrate 338 with a patterned layer of photoresist 342 for forming stand-offs 340. The depth of resist layer 342 should be slightly less than the desired height of protruding embossing teeth to be formed on the desired forming tool. More particularly, resist layer 342 is preferably equal to the desired tooth height, less the thickness of cantilevered tangs 350 which will be deposited in step 1906, and less the thickness of any stepped areas deposited in optional step 1908. Openings 344 for stand-offs 340 extend to the surface of substrate 338, so that stand-offs 340 will be adhered to the substrate. Preferably, openings 344 (and stand-offs 340 formed therein) are shaped, in plan view, the same as protruding areas 114 (such as previously described) of the desired embossing teeth.

Figure 18B:
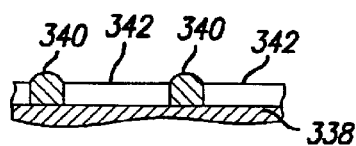
Figure 18C:
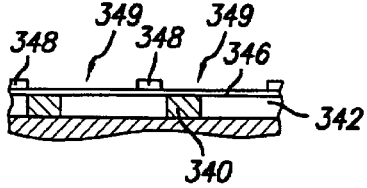
Figure 18D:
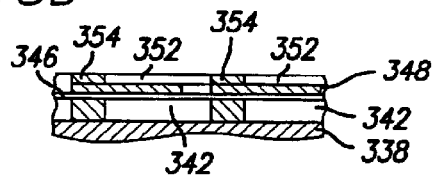
Figure 19:
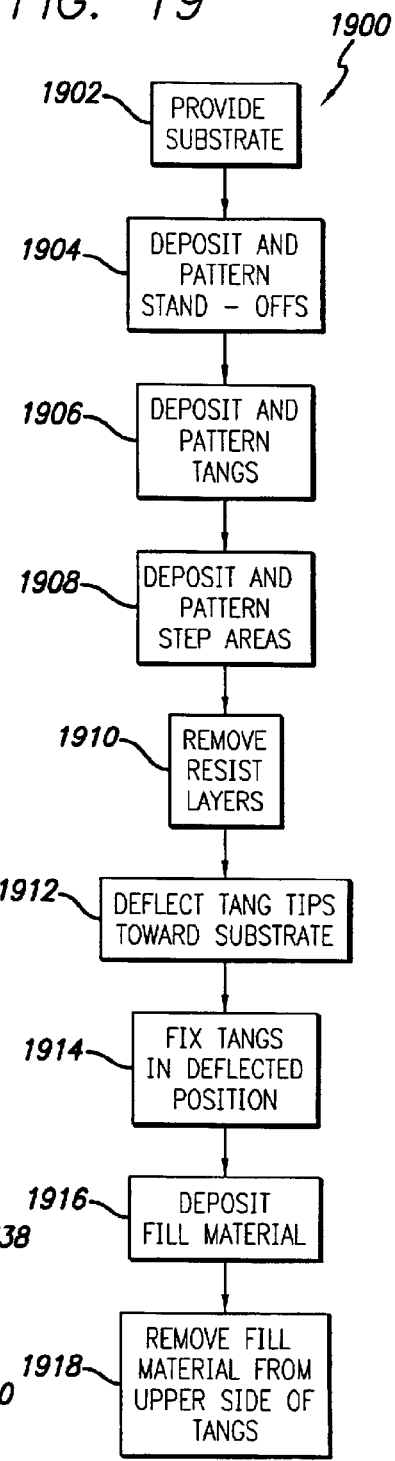
FIG. 19 is a flow diagram showing exemplary steps of an independent-tang method for making a microelectronic spring mold forming tool.

FIG. 18B shows stand-offs 340 after being deposited in openings 344. Stand-offs 340 are preferably comprised of a metallic material, such as nickel, deposited by electroplating into openings 344. Upper surfaces of stand-offs 340 are optionally planarized, if necessary, prior to step 1906. FIG. 18C shows planarized stand-offs 340 and resist layer 342 covered by an optional seed layer 346. Seed layer 346, deposited in preparation for subsequent electroplating, comprises a thin layer of conductive material deposited by a method such as sputtering. Patterned second resist layer 348 is deposited on top of seed layer 346 (or, if there is no seed layer, on the upper surface of resist layer 342), having openings 349 patterned in the shape of the desired cantilevered tangs 350 to be formed therein. Resist layer 342 is preferably about as thick as the desired cantilevered tangs 350. Step 1906 is completed by deposition of a resilient material, preferably the same as or compatible with the metallic material used for stand-offs 340, in openings 349 to form cantilevered tangs 350 attached to stand-offs 340. Cantilevered tangs 350 are preferably deposited by electroplating, and have their upper surfaces planarized, if necessary, prior to step 1908.

Optional step 1908 is performed if a stepped embossing tooth is desired, as previously described. A third layer of photoresist 352 is deposited, and patterned to have openings disposed over stand-offs 340. A layer of resilient material, preferably the same as the material used for tangs 350 and stand-offs 340, is deposited in the openings, such as by electroplating, to form stepped areas 354, shown in FIG. 18D.

Figure 18E:
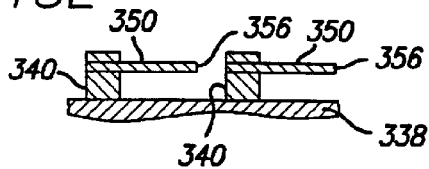
Figure 18F:
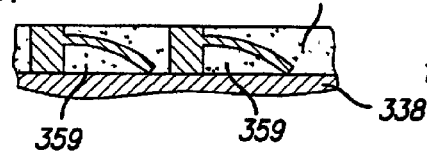
Figure 18G:
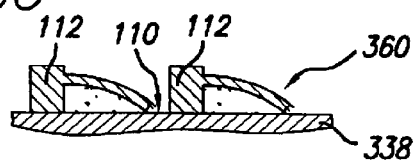

At step 1910, resist layers 342, 348, and 352 are stripped to reveal free-standing, cantilevered tangs 350 standing above substrate 338 on stand-offs 340. Each tang 350 has a free tip 356, an intermediate cantilevered portion between free tip 356 and an end of the tang 350 attached to stand-off 340, as shown in FIG. 18E, and comprises a plan form for a desired embossing tooth. At step 1912, free tips 356 are deflected towards substrate 338, and preferably brought into contact with it, as shown in FIG. 18F. Various methods may be used to deflect tips 356 towards substrate 338. The stress gradient technique discussed in connection with method 1700 may be adapted for this purpose. Alternatively, force is applied magnetically, electrostatically, or by physical contact with a fixture. The force of gravity may also be used, provided that the material used in tangs 350 softens sufficiently when annealed to deflect under its own weight. Tip 356 is preferably adhered to substrate 338, such as by solder, or is otherwise held in position at step 1914. At step 1916, while the tangs 350 are fixed in a deflected position, a filler material 358, such as SU-8 or an acrylic material, is deposited on substrate 338 to a depth sufficient to fill regions 359 underneath tangs 350, i.e., between tangs 350 and substrate 338. At step 1918, the filler material 358 is selectively removed from the upper side of tangs 350 and from substrate 338 everywhere except from regions 359, using a process such as photolithography or laser ablation. As shown in FIG. 18G, a forming tool 360 is thereby revealed, having an embossing surface 110 comprising embossing teeth 112, as previously described.

Segment-Assembly Method

Figure 21:
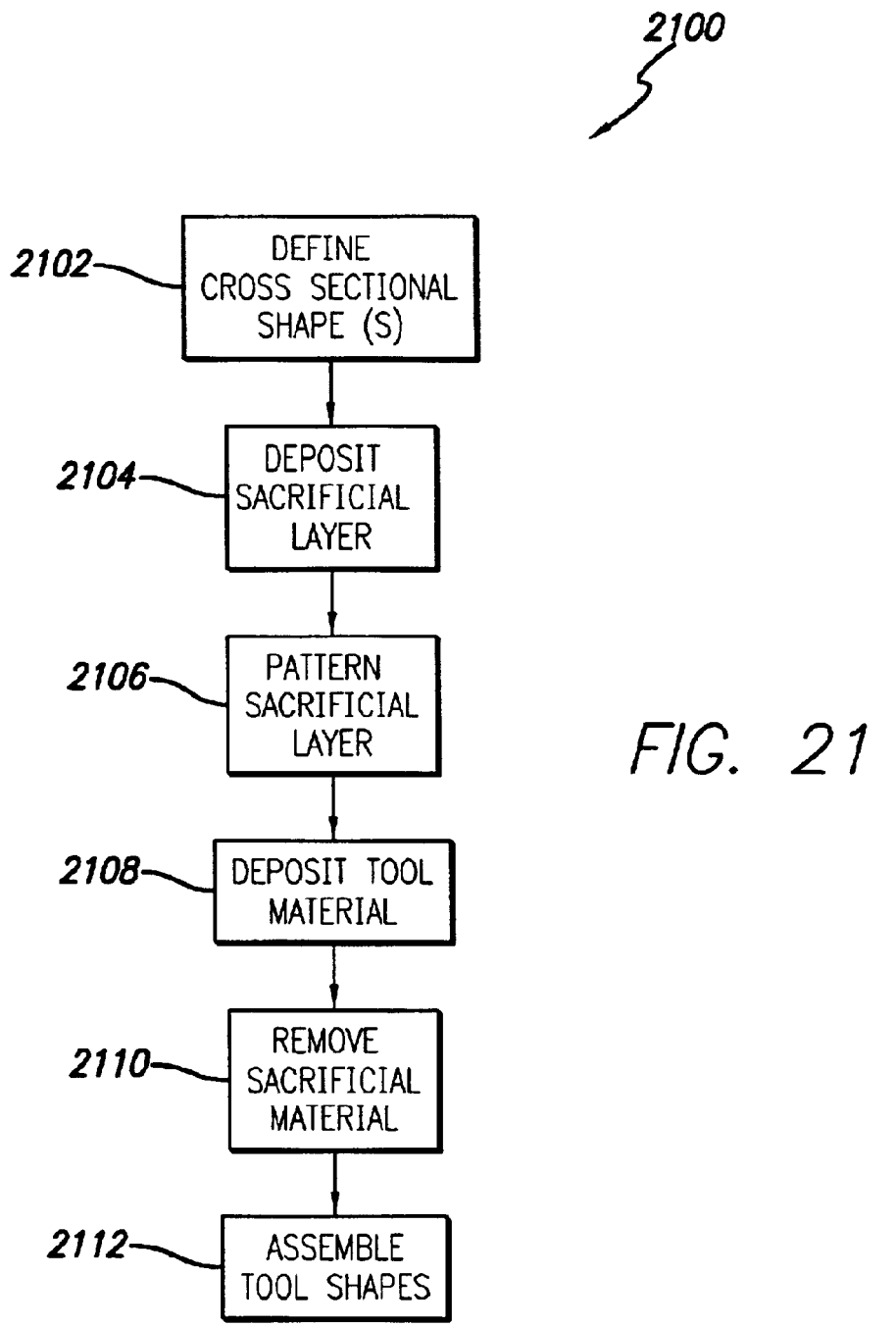
FIG. 21 is a flow diagram showing exemplary steps of a sectional assembly method for making a microelectronic spring mold forming tool.

In an alternative embodiment, an embossing tooth and/or a plurality of embossing teeth assembled into a forming tool are made by defining a tooth profile in a segment taken at a defined cross section of the forming tool, and assembling the segments to define a tooth and/or a tool. Unlike other methods disclosed herein, each segment defines a side profile of an embossing tooth (or a section of an embossing tooth). In comparison, in other methods disclosed herein where a forming tool is assembled from different components, for example, method 1900 which assembles tangs and stand-offs, each of the components defines portions of a plan view shape of an embossing tooth component. Fabrication in segments is especially useful for forming embossing teeth with features as shown in FIG. 20D, such as recessed channels 388 or ribs on sloped portions 116, that can readily be defined by stacking cross-sectional segments. Exemplary steps of a method 2100 for assembling cross-sectional segments to form a forming tool are shown in FIG. 21, and related views of assembly materials during steps of method 2100 are shown in FIGS. 20A–20D. Various views of forming tools and embossing teeth according to alternative embodiments related to method 2100 are shown in FIGS. 22A–22C and FIGS. 24–25.

At step 2102, the desired cross-sectional shapes are defined at a design stage by sectioning the desired tool to be formed into sections. For example, if teeth having a central channel 388 (for forming a ribbed spring structure) in a length direction of sloped portion 116 as shown in FIG. 20D are desired, a division into three cross sections, two of which are identical, is feasible. At step 2104, a process for making each desired cross-sectional segment using lithographic techniques is then begun, by depositing a sacrificial layer of resist 362 on a suitably prepared substrate 366. At step 2104, the resist layer 362 is patterned to expose a second resist layer 363, which serves as a release layer on substrate 366, as shown in FIG. 20B. In the alternative, substrate 366 is selected from a material that may readily be removed or released without damaging the segment of selected tool material, and resist layer 362 is patterned to expose substrate 366. In either case, resist layer 362 is patterned in the desired cross sectional shapes for each segment. As shown in FIG. 20B, a conductive seed layer 346 for electroplating is preferably provided between resist layers 362 and 363. At step 2108, a tool material 364, such as a metal, is deposited in the opened areas of resist layer 362, to form segments of tool material 376, as shown in FIGS. 20A and 20B. For example, if a forming tool with stepped embossing teeth 3 mils wide and having a single longitudinal channel is desired, three cross-sectional segments, each 1 mil thick, may be defined. Continuing the example, two of the segments would be of an identical shape 368, having a step height "$h_1$", as shown in FIG. 20A. A third segment would have a corresponding but different shape 370, having a step height "$h_2$" wherein "$h_2$" is greater than "$h_1$" by an amount equal to the desired depth of the recessed channel.

For structural strength, segments 376 are typically deposited by electroplating. Plates 376 are preferably provided with alignment features, such as alignment holes 372 and/or alignment tabs 374. The upper surface 378 of segments 376 is preferably planarized to ensure a smooth fit between adjoining segments in subsequent assembly step 2112. Resist layers 362, 363 are then removed to free segments 376. It should be apparent that various alternative methods may be used to make segments 376. For example, segments 376 may be cut from thin metal sheets using laser ablation, lithographic etching, or a precision water jet.

Once fabricated, segments 376 are assembled in order by stacking them in aligned relation. FIG. 20C shows an exploded partial assembly of a segmented forming tool 382, and FIG. 20D shows a perspective partial view of an assembled segmented forming tool, with three of many segments shown. Alignment pins, such as pin 380, may be inserted through holes 372 to assist in aligning segments 376, as shown in FIGS. 20C and 20D. A fastener (not shown), such as a machine screw or rivet, may alternatively be inserted through holes 372 to fasten segments 376 together. In the alternative, segments 376 may be assembled and clamped together on an assembly fixture (not shown). While clamped together, the segments may be joined, for example, by soldering, welding, or brazing; or by application of a suitable adhesive such as an epoxy resin. Segmented forming tool 382 will thus be provided with a segmented embossing surface 384 comprising cooperating edges of a plurality of segments 376.

Figure 22A:
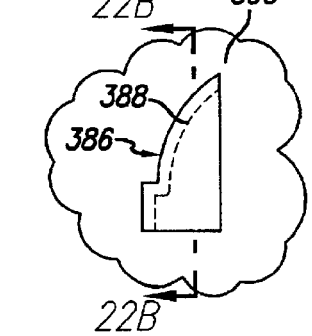
FIG. 22A is a plan view of stacked patterned layers of tool material during an exemplary step of a lithographic sectional assembly method for making a microelectronic spring mold forming tool.
Figure 22B:
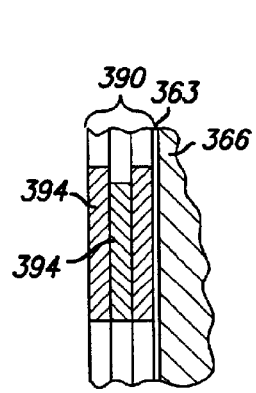
FIG. 22B is a cross-sectional view of stacked patterned layers of tool material during an exemplary step of a lithographic sectional assembly method for making a microelectronic spring mold forming tool.
Figure 22C:
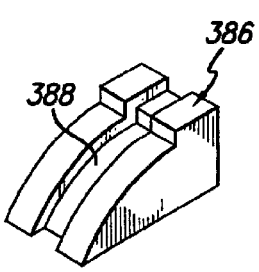
FIG. 22C is a perspective view of an exemplary embossing tooth for forming a mold for a microelectronic spring having a beam with a central rib, made by a lithographic sectional assembly method.

Segmented forming tools and/or embossing teeth may also be assembled lithographically, by building up multiple connected layers on a substrate. FIG. 22A shows a plan view of a segmented embossing tooth 386 having a recessed channel 388 defined in multiple layers of photoresist 390 on a substrate 366. The layered construction of embossing tooth 386 is visible in the cross-sectional view of FIG. 22B, and in the perspective view shown in FIG. 22C. It should be apparent that such a tooth may be formed by depositing a first layer of tool material 392 on substrate 366 or on release resist layer 363, and then depositing and patterning subsequent layers 394 using lithographic techniques as previously described. Each layer of tool material comprises a cross-sectional segment of a segmented embossing tool. Unlike the tool shown in FIG. 20C, there is no need to separately assemble tooth segments, because the segments are joined as they are deposited. If desired, a plurality of embossing teeth like tooth 386 shown in FIG. 22C may be formed together in a row, and the rows of embossing teeth then assembled into a forming tool, as previously described.

Figure 23:
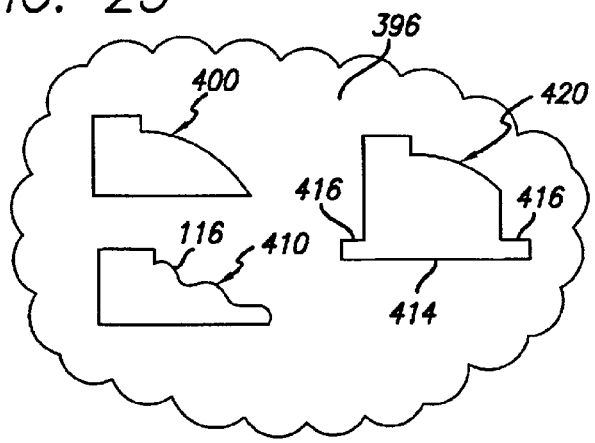
FIG. 23 is a plan view of a patterned layer of tool material for use in embossing segment-assembly methods for making a microelectronic spring mold forming tool according to the invention.
Figure 24:
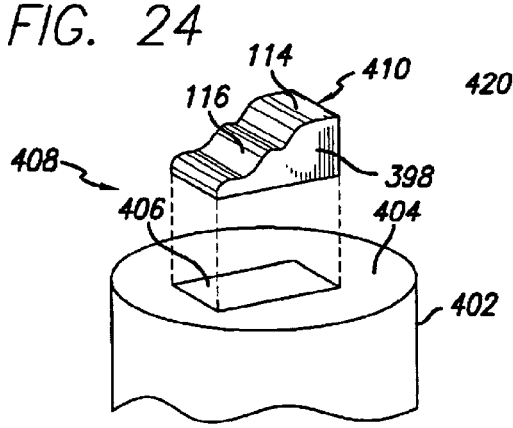
FIG. 24 is a perspective view of a transparent embossing segment and light guide for assembly into a forming tool for use in a repetitive-stamping method, wherein the transparent embossing segment is made from a patterned layer of tool material.

Defining a tooth by its side profile (not necessarily segmented into more than one section) is also useful for embossing teeth having complex side profiles. For example, FIG. 23 shows a corrugated profile on a corrugated embossing tooth 410 on a substrate 396, having corrugations in a length direction of sloped portion 116. Less complex profiles, such as shown on teeth 400 and 420, may also be formed in this way. That such teeth may be cut from a sheet of tool material has already been disclosed herein. In addition, embossing teeth may be lithographically defined by their side profiles out of a resist material such as SU-8. In this embodiment, substrate 396 shown in FIG. 23 is a layer of uncured SU-8, and teeth 400, 410, and 420 are cured regions of SU-8. Such teeth 400, 410, and 420 can thus be made transparent to UV light, for use in a forming tool having transparent teeth. For example, tooth 410, after being removed from substrate 396, may be attached to an end 404 of a fiber optic light guide 402, as shown in FIG. 24. End 404 is preferably coated with a UV-opaque material, such as aluminum, except in a region 406 underneath the tooth. Sidewalls 398 of tooth 410 are also preferably coated with a UV-opaque material. The completed assembly comprises a forming tool 408 similar to UV-transparent forming tool 244 used in method 900, as previously described. A forming tool shaped like 244 shown in FIG. 8A may be formed in a similar fashion by modifying the shape of sloped portion 116 and protruding area 114, as should be apparent from the foregoing disclosure.

Figure 25:
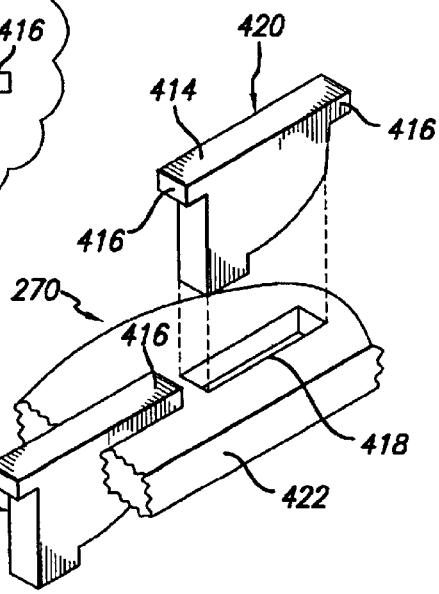
FIG. 25 is a perspective view of transparent embossing segments and an opaque carrier for assembly into a forming tool having transparent and opaque portions, wherein the transparent embossing segments are made from a patterned layer of tool material.

Tooth profiles may additionally comprise features such as base 414 and tabs 416 of tooth 420, shown in FIGS. 23 and 25. Such additional features facilitate assembly of tooth 420 onto a substrate 422. In an embodiment of the invention, tooth 420 is formed of a UV-transparent material, such as SU-8, and a plurality of teeth like tooth 420 are assembled in an opaque substrate 422, by inserting each tooth 420 through a hole 418 in substrate 422, as shown in FIG. 25. Each tooth 420 may be inserted individually, such as by using a robotic assembler. In the alternative, teeth 420 may be positioned in holes 418 using a fluidic or vibration/gravity-based assembly technique which may be capable of positioning multiple teeth simultaneously. In this way, a forming tool 270 having opaque and transparent portions, such as for use in method 1100 as disclosed above, may be formed. If desired, teeth such as tooth 240 may be formed in a continuous strip, similar to the profile of segments 376 previous discussed, and assembled in strips into opaque material 422. For example, the adjacent teeth 420 shown in FIG. 25 may be formed so that they are joined together at their closest adjacent tabs 416, without requiring other modifications to the configuration shown.

Having thus described a preferred embodiment of a forming tool for forming a sacrificial substrate for making microelectronic spring structures, and methods for making the forming tool, it should be apparent to those skilled in the art that certain advantages of the within system have been achieved. It should also be appreciated that various modifications, adaptations, and alternative embodiments thereof may be made within the scope and spirit of the present invention. For example, a forming tool for use in making microelectronic spring structures has been illustrated, but it should be apparent that the inventive concepts described above would be equally applicable to forming tools for similar microelectronic and micromechanical structures. The invention is further defined by the following claims.

What is claimed is:

1. A microelectronic spring contact mold forming tool, comprising:

abase; and a plurality of embossing teeth attached to said base, each said embossing tooth comprising a protruding portion and a sloped portion, wherein said plurality of teeth are disposed in a spatial relationship one to another such that a location of each said protruding portion corresponds to an electrical connection location on an electronic device, wherein said embossing teeth extend through said base, and wherein said base is substantially opaque to radiation and said embossing teeth are substantially transparent to radiation.

2. The microelectronic spring contact mold forming tool of claim 1, wherein at least one of said teeth is recessed below a surface of said base.

3. The microelectronic spring contact mold forming tool of claim 1, wherein said sloped portion of said embossing tooth protrudes from a surface of said base.

4. The microelectronic spring contact mold forming tool of claim 1, wherein said sloped portion of said embossing tooth is recessed below a surface of said base.

5. The microelectronic spring contact mold forming tool of claim 1, wherein said embossing teeth are configured to form molds for microelectronic spring contacts when the teeth are impressed into a layer of moldable material disposed on said electronic device.

6. The microelectronic spring contact mold forming tool of claim 5, wherein said sloped portion of each of said plurality of embossing teeth protrudes from a surface of said base.

7. The microelectronic spring contact mold forming tool of claim 5, wherein said sloped portion of each of said plurality of embossing teeth is recessed below a surface of said base.

8. The microelectronic spring contact mold forming tool of claim 1, wherein at least one embossing tooth has a height between 5 and 100 mils.

9. The microelectronic spring contact mold forming tool of claim 1, wherein at least an adjacent two of said embossing teeth are separated by no more than 5 mils.

10. The microelectronic spring contact mold forming tool of claim 1, wherein a surface of said base from which said teeth extend is substantially planar.

11. The microelectronic spring contact mold forming tool of claim 1, wherein said base comprises a substantially uniform material.

12. The microelectronic spring contact mold forming tool of claim 11, wherein said substantially uniform material is selected from the group consisting essentially of nickel, cobalt, chrome, molybdenum, aluminum, copper, zinc, tin, iron, palladium, platinum, gold and alloys thereof.

13. The microelectronic spring contact mold forming tool of claim 1, wherein a surface of said base from which said teeth extend comprises a metal selected from the group consisting essentially of nickel, cobalt, chrome, molybdenum, aluminum, copper, zinc, tin, iron, palladium, platinum, gold and alloys thereof.

14. The microelectronic spring contact mold forming tool of claim 1, wherein said sloped portion of each said embossing tooth, viewed in a direction normal to of said base from which said teeth extend, is tapered so as to have a generally triangular shape.

15. The microelectronic spring contact mold forming tool of claim 2, wherein said sloped portion of each said embossing tooth, viewed in a direction normal to of said base from which said teeth extend, has a generally rectangular shape.

16. The microelectronic spring contact mold forming tool of claim 5, wherein sides of each said embossing tooth are beveled, whereby a release of said embossing tooth from the moldable material is facilitated.

17. The microelectronic spring contact mold forming tool of claim 1, wherein said embossing teeth are made by selectively removing tool material from said base.

18. The microelectronic spring contact mold forming tool of claim 1, wherein said embossing teeth are made by molding in a mold comprising at least one shaped depression.

19. The microelectronic spring contact mold forming tool of claim 1, wherein said embossing teeth are molded in a mold comprising at least one depression shaped by depositing a liquid in a cavity, thereby forming a liquid meniscus in the cavity.

20. The microelectronic spring contact mold forming tool of claim 1 further comprising a plurality of said bases disposed on a substrate, each said base comprising a set of embossing teeth disposed on said base in a spatial relationship one to another such that an location of each protruding portion of each tooth in said set corresponds to a electrical connection location on a semiconductor device.

21. The microelectronic spring contact mold forming tool of claim 1, wherein said sloped portion of each said embossing tooth further comprises a contoured surface.

22. The microelectronic spring contact mold forming tool of claim 1, wherein said sloped portion of each said embossing tooth comprises at least one channel in a length direction of said sloped portion.

23. The microelectronic spring contact mold forming tool of claim 1, wherein said sloped portion of each said embossing tooth comprises corrugations in a length direction of said sloped portion.

24. The microelectronic spring contact mold forming tool of claim 1, wherein said sloped portion of each said embossing tooth comprises a contour in a length direction of said sloped portion.

25. The microelectronic spring contact mold forming tool of claim 24, wherein said contour comprises a curve selected from the group consisting of: an S-curve, a convex curve, a concave curve, and a sinusoid.

26. The microelectronic spring contact mold forming tool of claim 1, wherein said sloped portion of each said embossing tooth, viewed in a direction normal to of said base from which said teeth extend, has a projected shape selected from the group consisting of: a trapezoid, an L-shape, a U-shape, a C-shape, a J-shape, a spiral, a square wave, and a sinusoid.

27. The microelectronic spring contact mold forming tool of claim 1, wherein said sloped portion of each said embossing tooth comprises parallel arms.

28. The microelectronic spring contact mold forming tool of claim 1, wherein said sloped portion of each said embossing tooth comprises a shape wherein a shortest distance between an end of said sloped portion adjoining said protruding portion and a distal end of said sloped portion is less than a shortest distance along a surface of said sloped portion between an end of said sloped portion adjoining said protruding portion and a distal end of said sloped portion.

29. The microelectronic spring contact mold forming tool of claim 1, further comprising means for controlling the temperature of said tool.

30. The microelectronic spring contact mold forming tool of claim 1, further comprising means for decreasing the thermal response time of said tool.

31. The microelectronic spring contact mold forming tool of claim 1, wherein said electronic device is a bare semiconductor die.

32. The microelectronic spring contact mold forming tool of claim 1, wherein said protruding portion of each said tooth corresponds to a base of an electronic spring contact to be formed at one of said electrical connection locations on said electronic device, and wherein said sloped portion of each said tooth corresponds to a beam of said electronic spring contact.

33. The microelectronic spring contact mold forming tool of claim 32, wherein said sloped portion of each tooth is configured such that said corresponding beam angles away from said electronic device.

34. The microelectronic spring contact mold forming tool of claim 20, wherein said bases are disposed such that locations of said protruding portions of said embossing teeth correspond to electrical connection locations on a plurality of electronic devices.

35. The microelectronic spring contact mold forming tool of claim 34, wherein said plurality of electronic devices are dice of an unsingulated semiconductor wafer.

36. The microelectronic spring contact mold forming tool of claim 35, wherein each base corresponds to one of said die.

37. The microelectronic spring contact mold forming tool of claim 1, wherein said radiation is light.

38. The microelectronic spring contact mold forming tool of claim 37, wherein said light is ultraviolet light.

* * * * *